(12) United States Patent
Neenan et al.

(10) Patent No.: US 8,022,771 B2
(45) Date of Patent: Sep. 20, 2011

(54) LINEARIZED TRANS-IMPEDANCE AMPLIFIERS

(75) Inventors: Michael A. Neenan, Plano, TX (US);
Christopher G. Szymanski, Willow Spring, NC (US); Eric E. Crawford, Austin, TX (US)

(73) Assignee: Parsec Technologies, Inc., Plano, TX (US)

( * ) Notice: Subject to any disclaimer, the term of this patent is extended or adjusted under 35 U.S.C. 154(b) by 0 days.

(21) Appl. No.: 12/510,415

(22) Filed: Jul. 28, 2009

(65) Prior Publication Data

US 2009/0285579 A1 Nov. 19, 2009

Related U.S. Application Data

(63) Continuation of application No. 12/043,299, filed on Mar. 6, 2008, now Pat. No. 7,567,130, which is a continuation of application No. 10/993,969, filed on Nov. 19, 2004, now Pat. No. 7,388,435.

(60) Provisional application No. 60/527,587, filed on Dec. 5, 2003.

(51) Int. Cl.
*H03F 3/08* (2006.01)

(52) U.S. Cl. ...................................................... 330/308
(58) Field of Classification Search .................. 330/308; 250/214 A, 214 AG
See application file for complete search history.

(56) References Cited

U.S. PATENT DOCUMENTS

| 5,111,156 | A  |   | 5/1992 | Hachiuma |
|-----------|----|---|--------|----------|
| 5,166,819 | A  | * | 11/1992 | Eichel ........................ 250/214 A |
| 6,384,399 | B1 |   | 5/2002 | Umeda |
| 6,396,351 | B1 |   | 5/2002 | Buescher et al. |
| 6,771,132 | B1 | * | 8/2004 | Denoyer et al. ............. 330/308 |
| 7,026,877 | B2 | * | 4/2006 | Yi ................................. 330/308 |

\* cited by examiner

*Primary Examiner* — Khanh Nguyen
(74) *Attorney, Agent, or Firm* — McDermott Will & Emery LLP

(57) ABSTRACT

The disclosed systems and methods utilize an advanced linearized trans-impedance amplifier (ATIA) that allows for the recovery and amplification of low amplitude analog and digital signals. This disclosure further describes unique approaches of addressing issues inherent in the transmission and reception of small amplitude multi-carrier signals used for distribution of voice, video, and data communications over both fiber optic cables and free space transmitters.

17 Claims, 28 Drawing Sheets

Figure 1: Prior Art PON Video Distribution

Figure 2: Prior Art Video Signal Recovery using a Matching Transformer

Figure 3 – Prior art CATV/PON optical distribution network

Figure 4 – Prior art termination of CATV/PON network

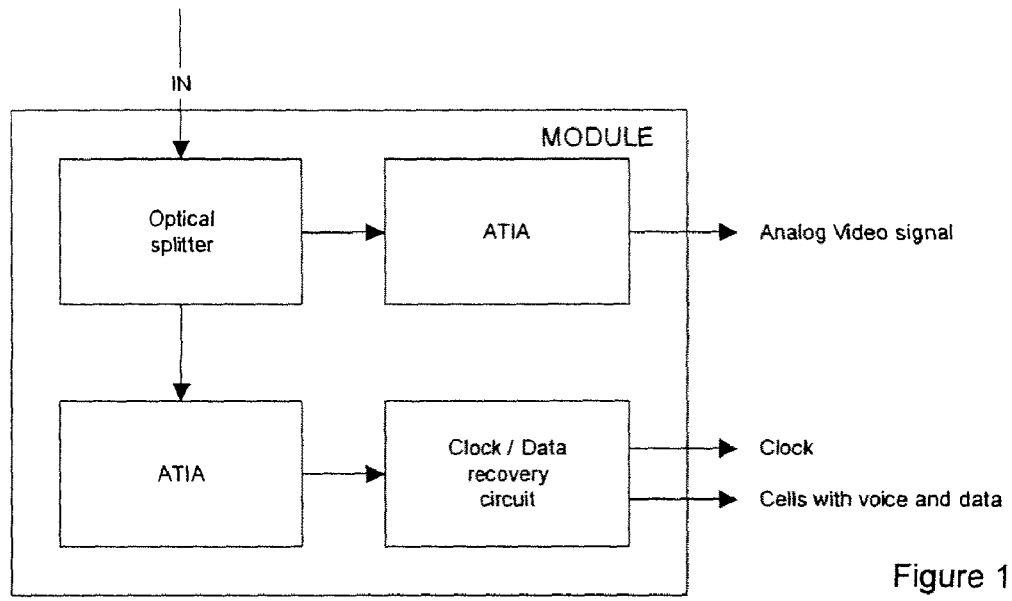
Figure 10-A
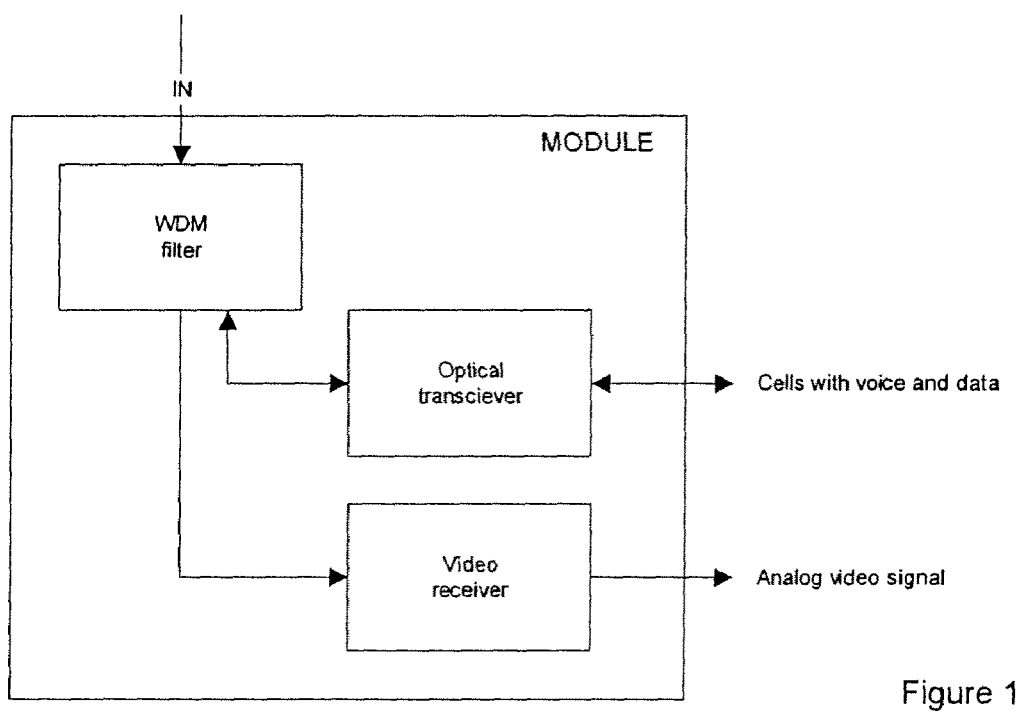
Figure 10-B

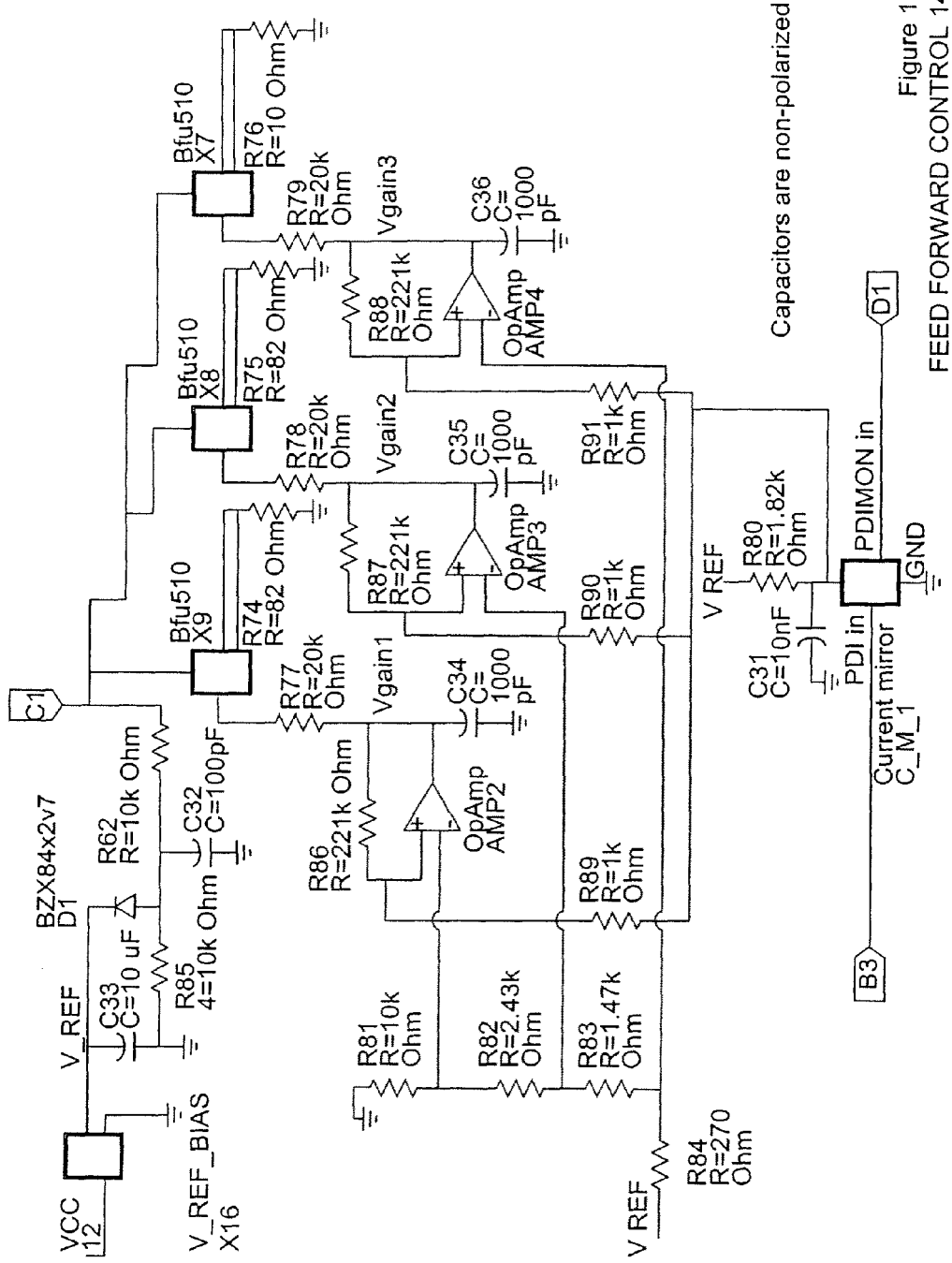
Figure 11-A FEED FORWARD CONTROL 1400

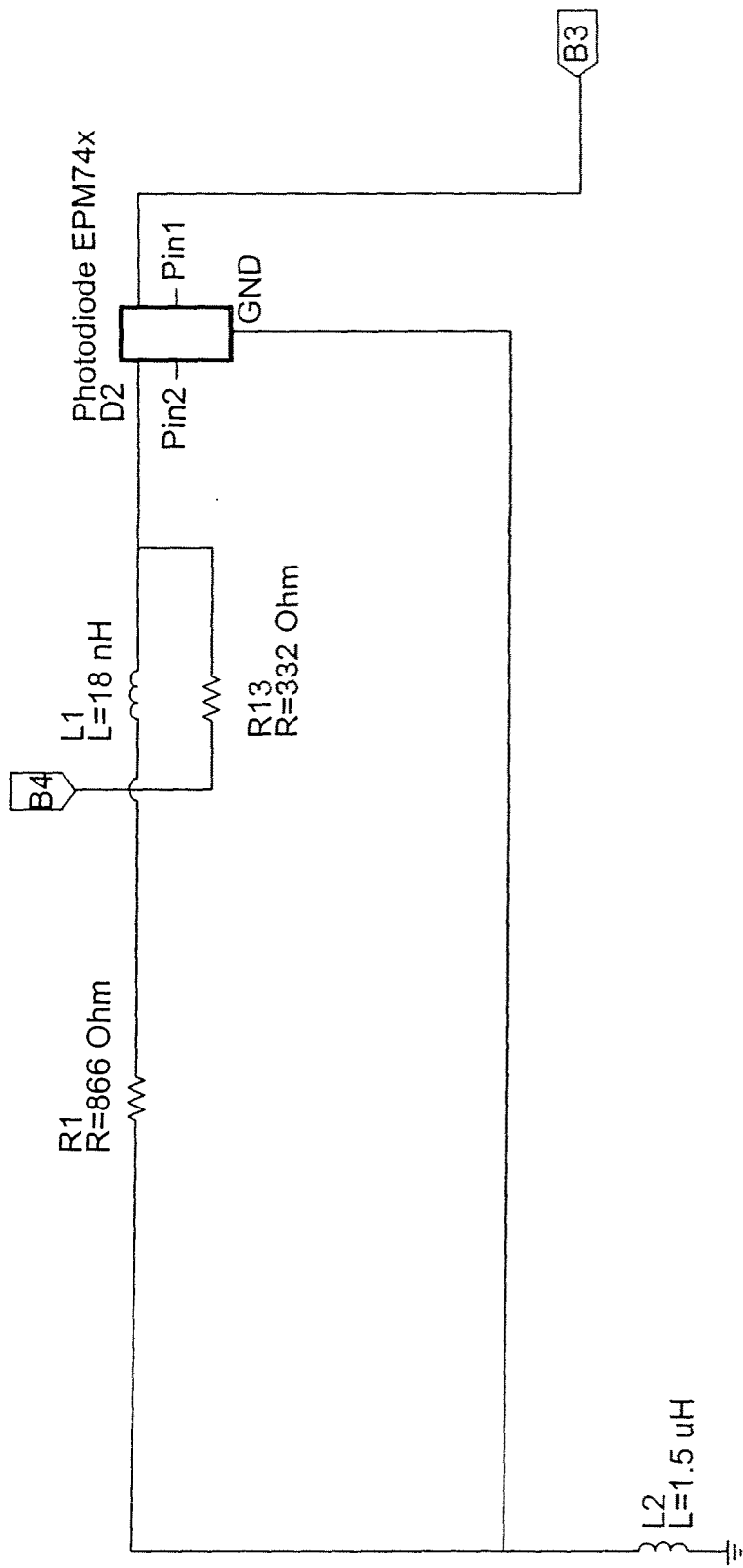
Figure 11-B
SENSOR 1100

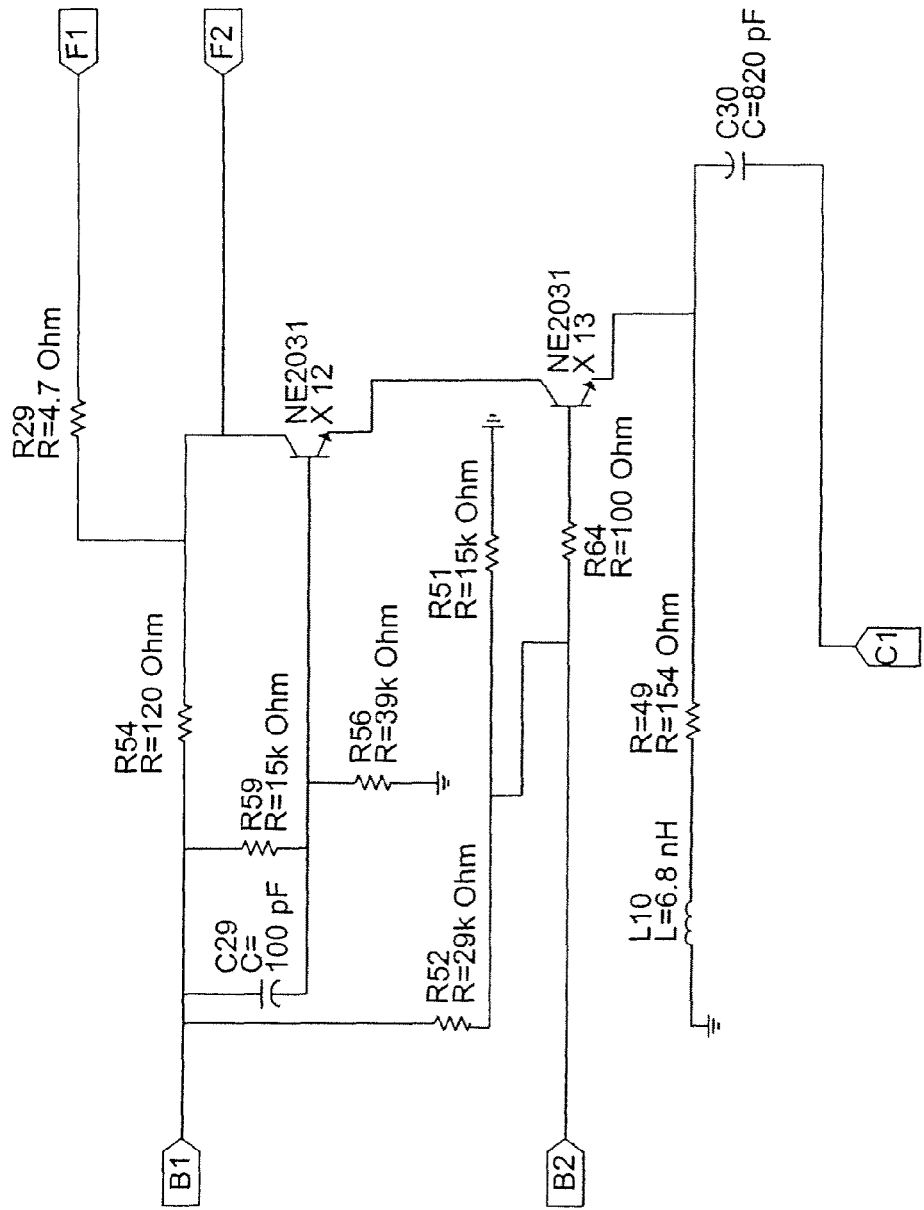
Figure 11-C
POWER GAIN LINEARIZATION 1300

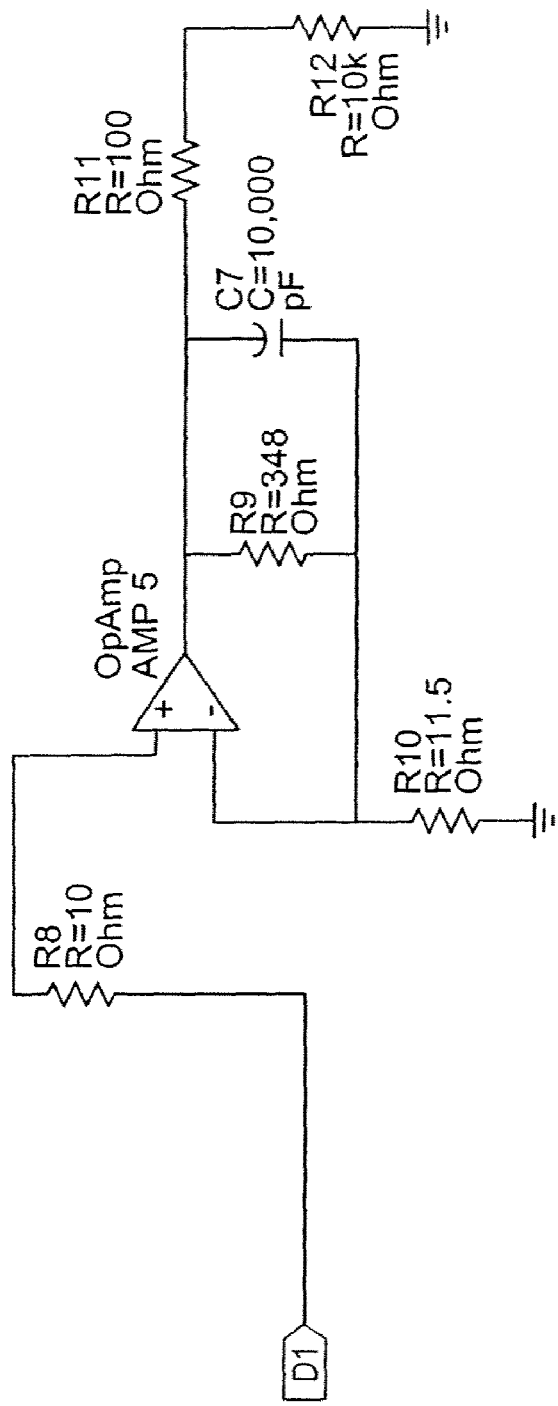
Figure 11-D
SENSOR MONITOR 1500

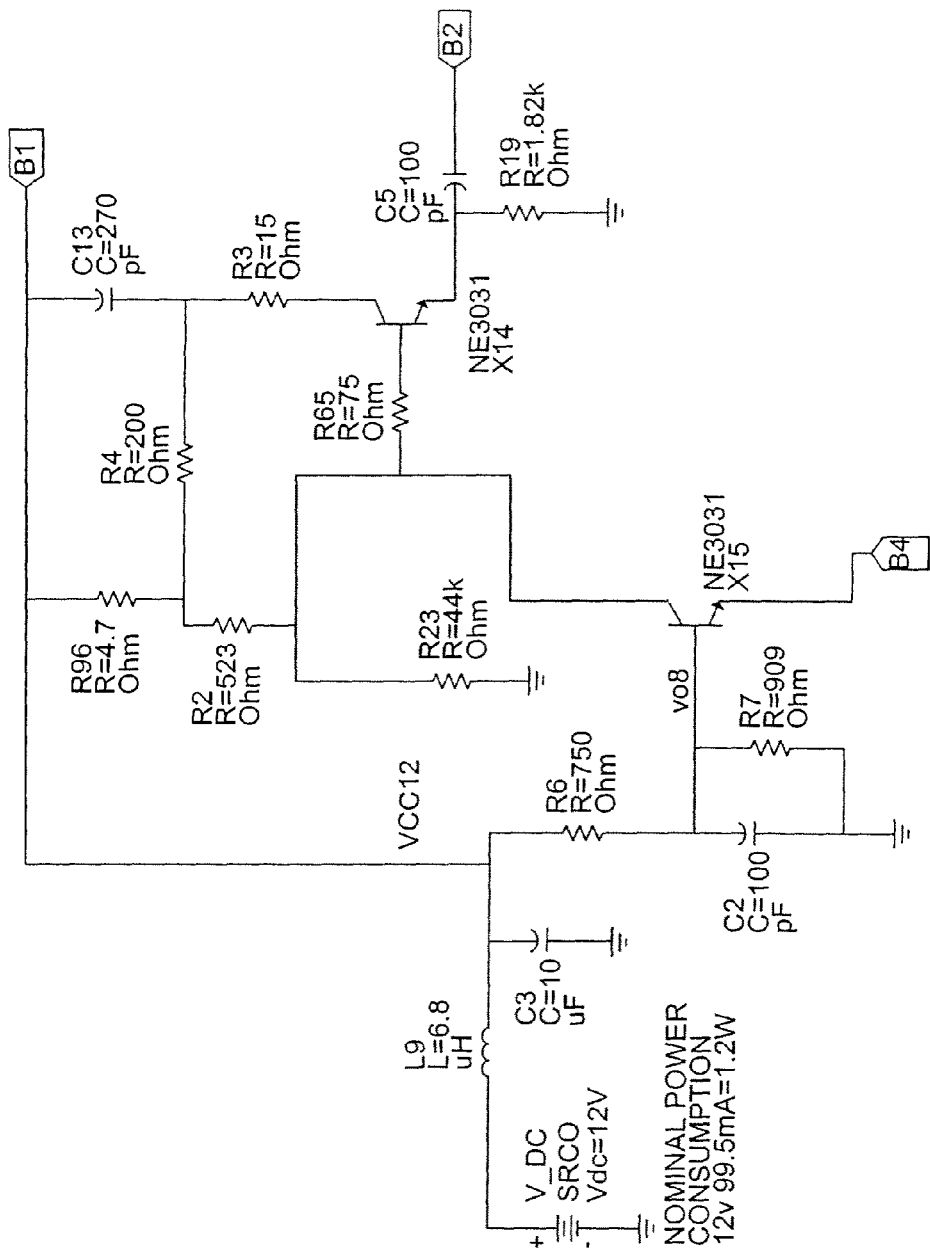
Figure 11-E
SENSOR COUPLING / VOLTAGE CONVERSION 1200

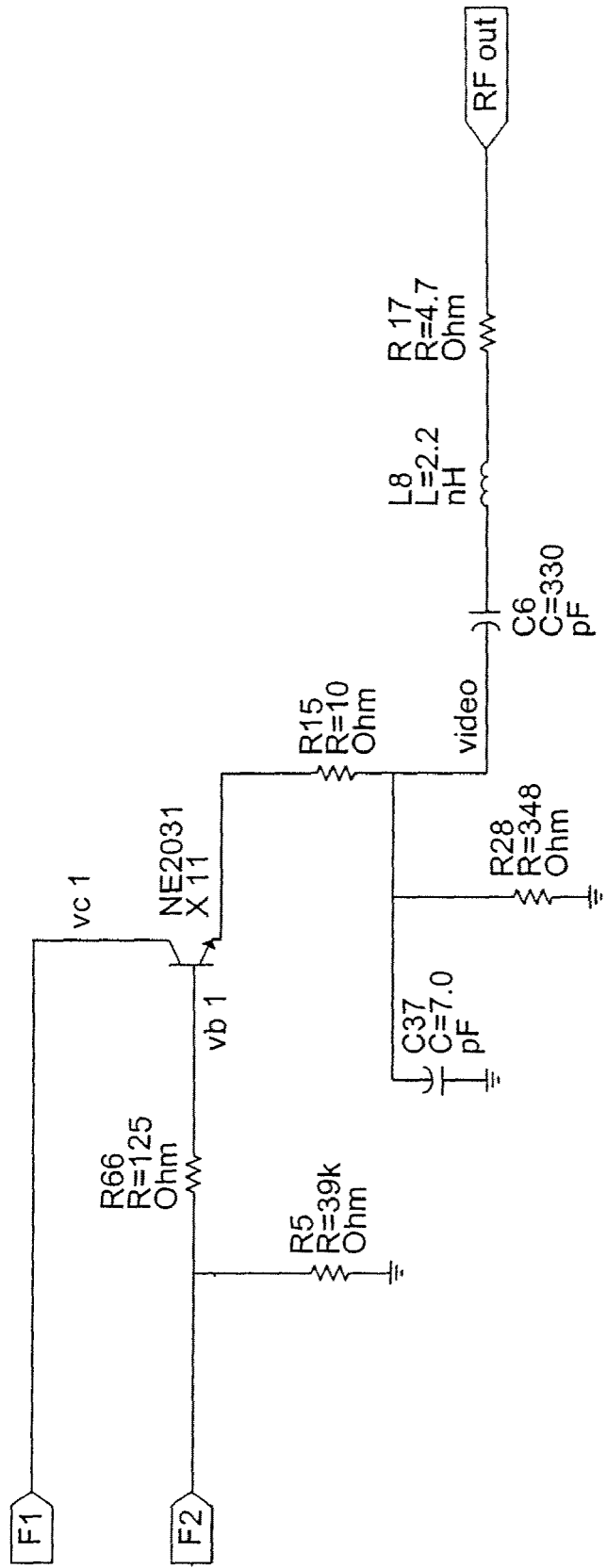
Figure 11-F
IMPEDANCE MATCHING 1600

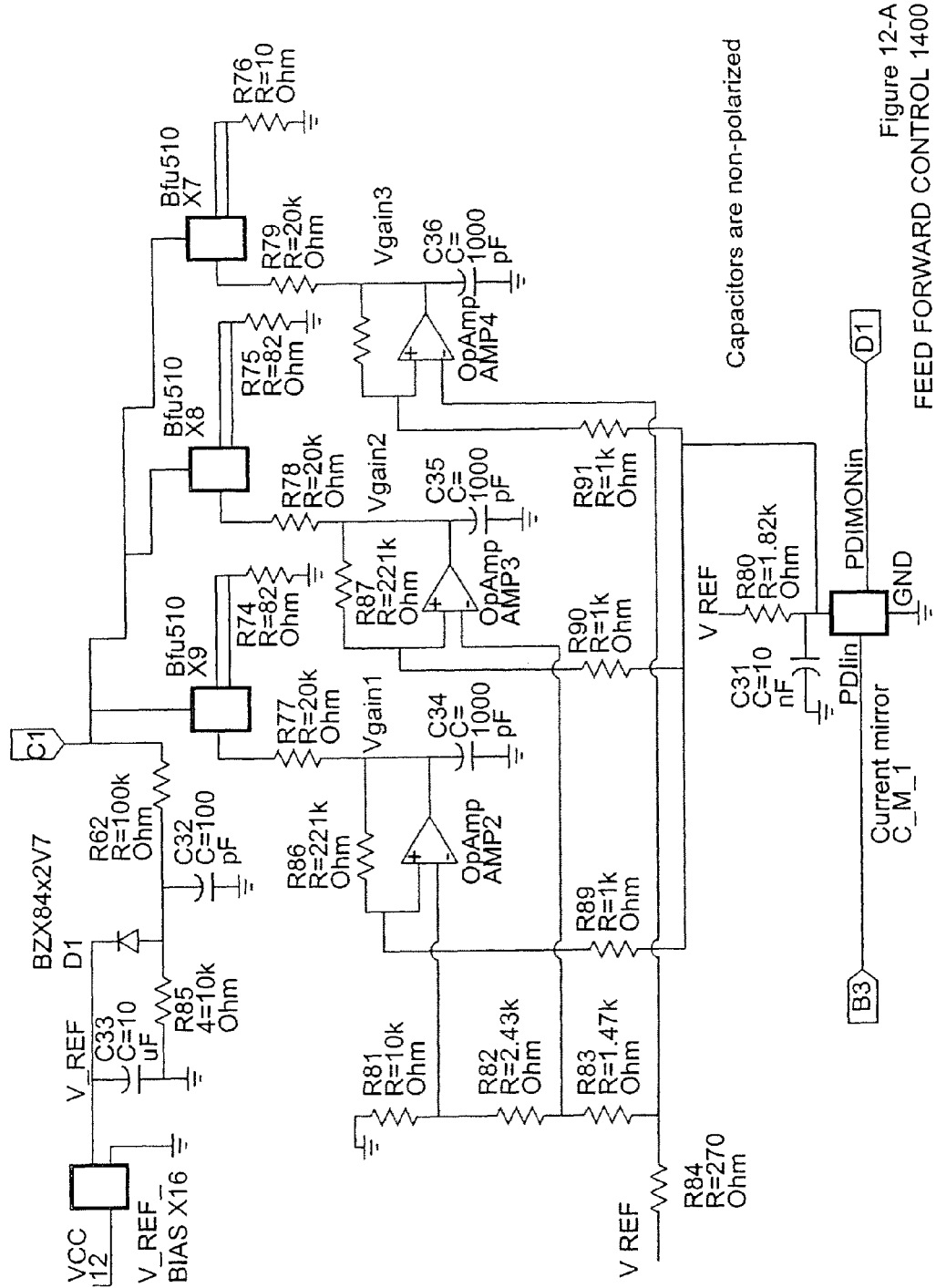
Figure 12-A FEED FORWARD CONTROL 1400

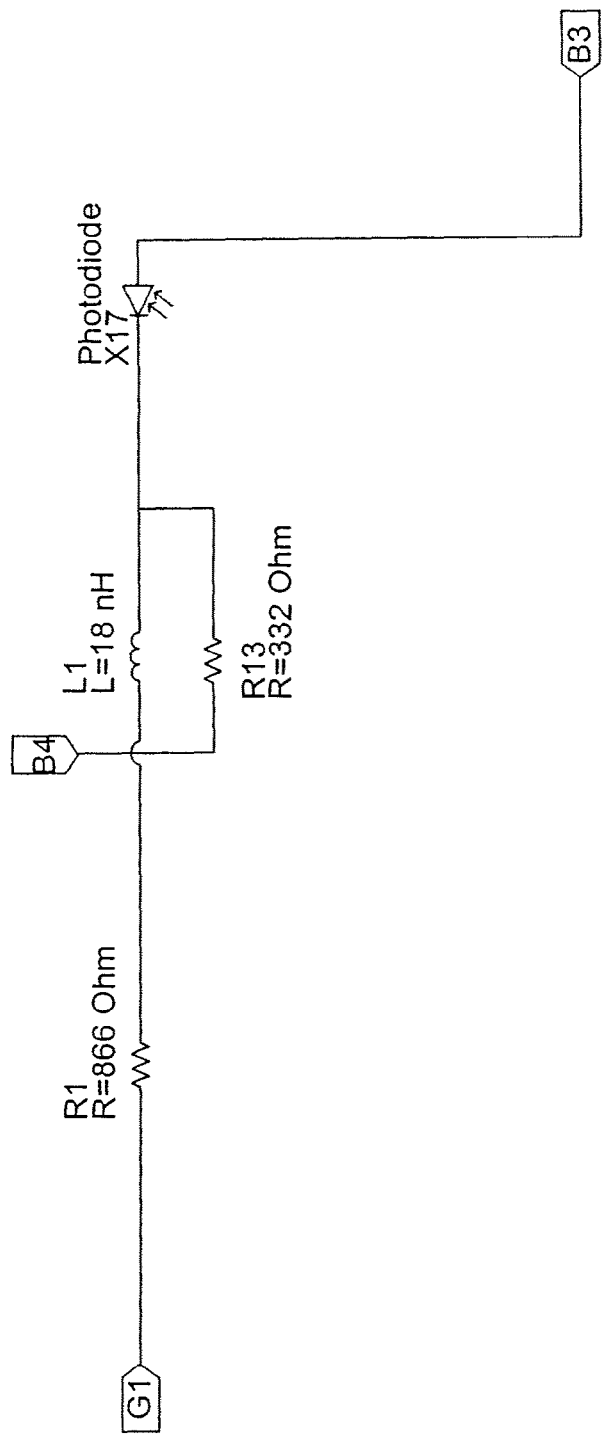
Figure 12-B
SENSOR 1100

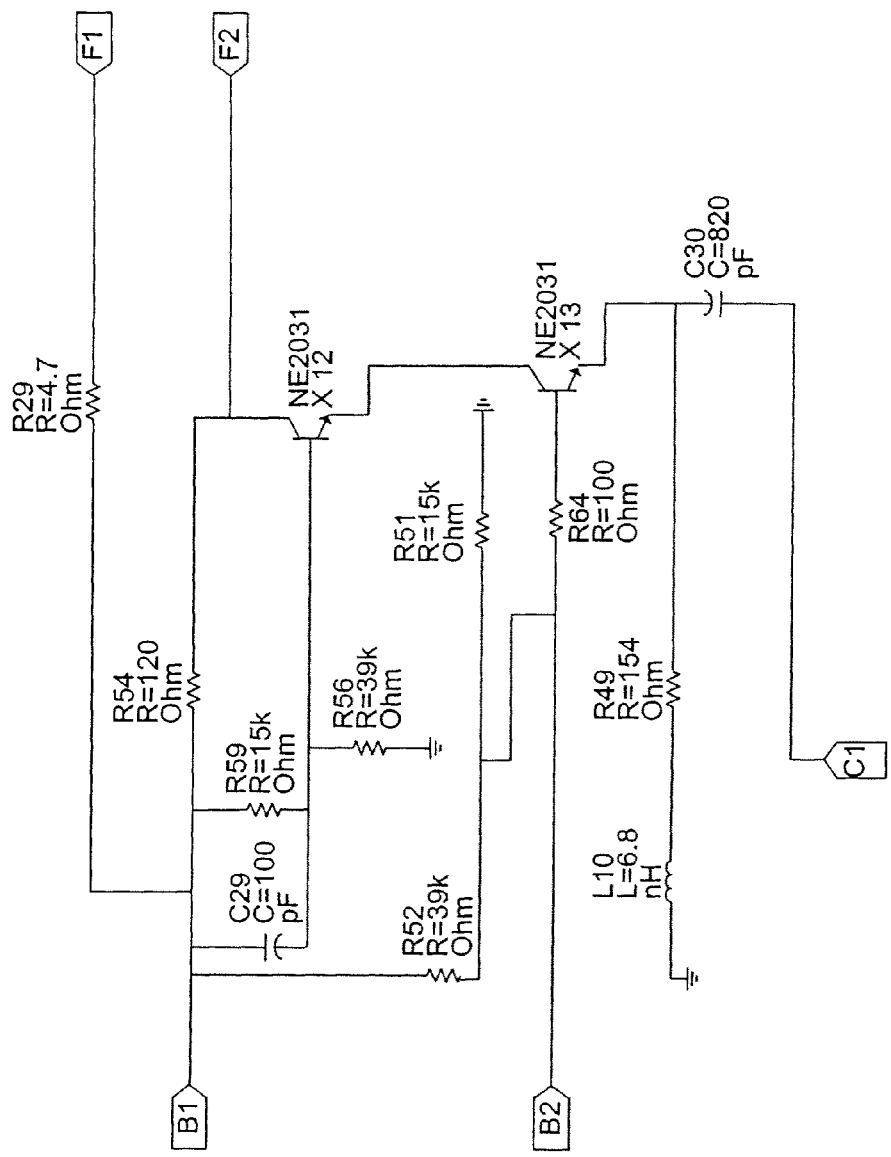
Figure 12-C
POWER GAIN / LINEARIZATION 1300

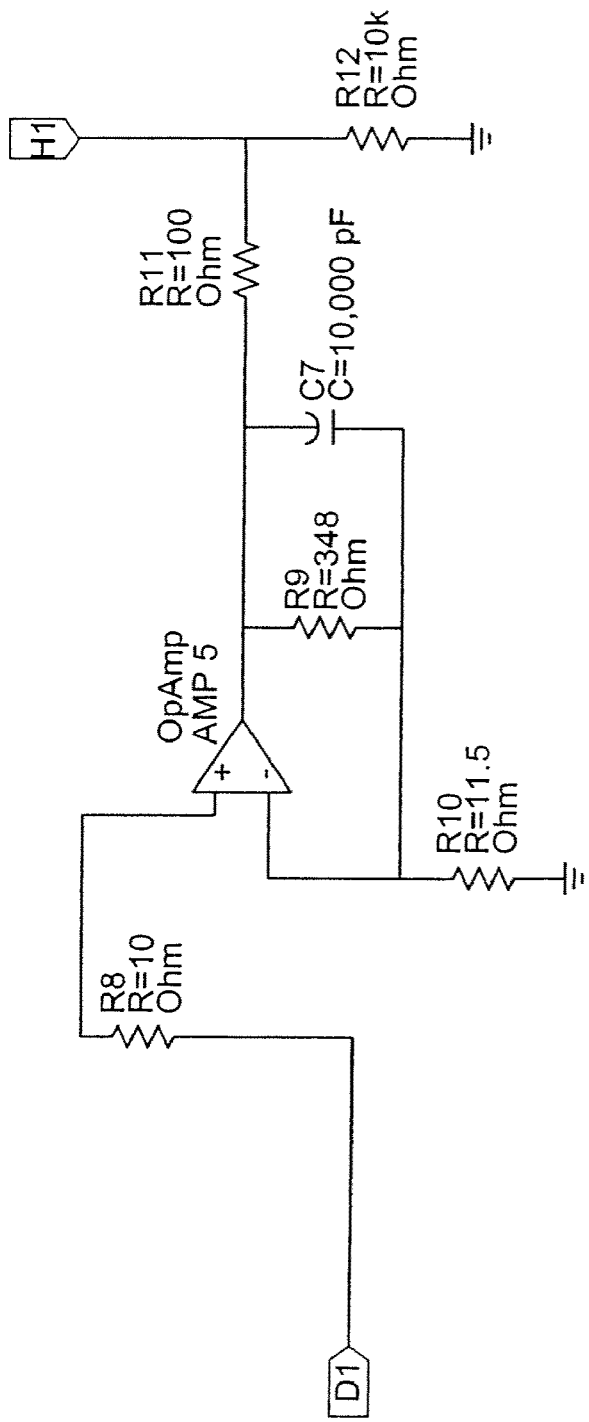
Figure 12-D
SENSOR MONITOR 1500

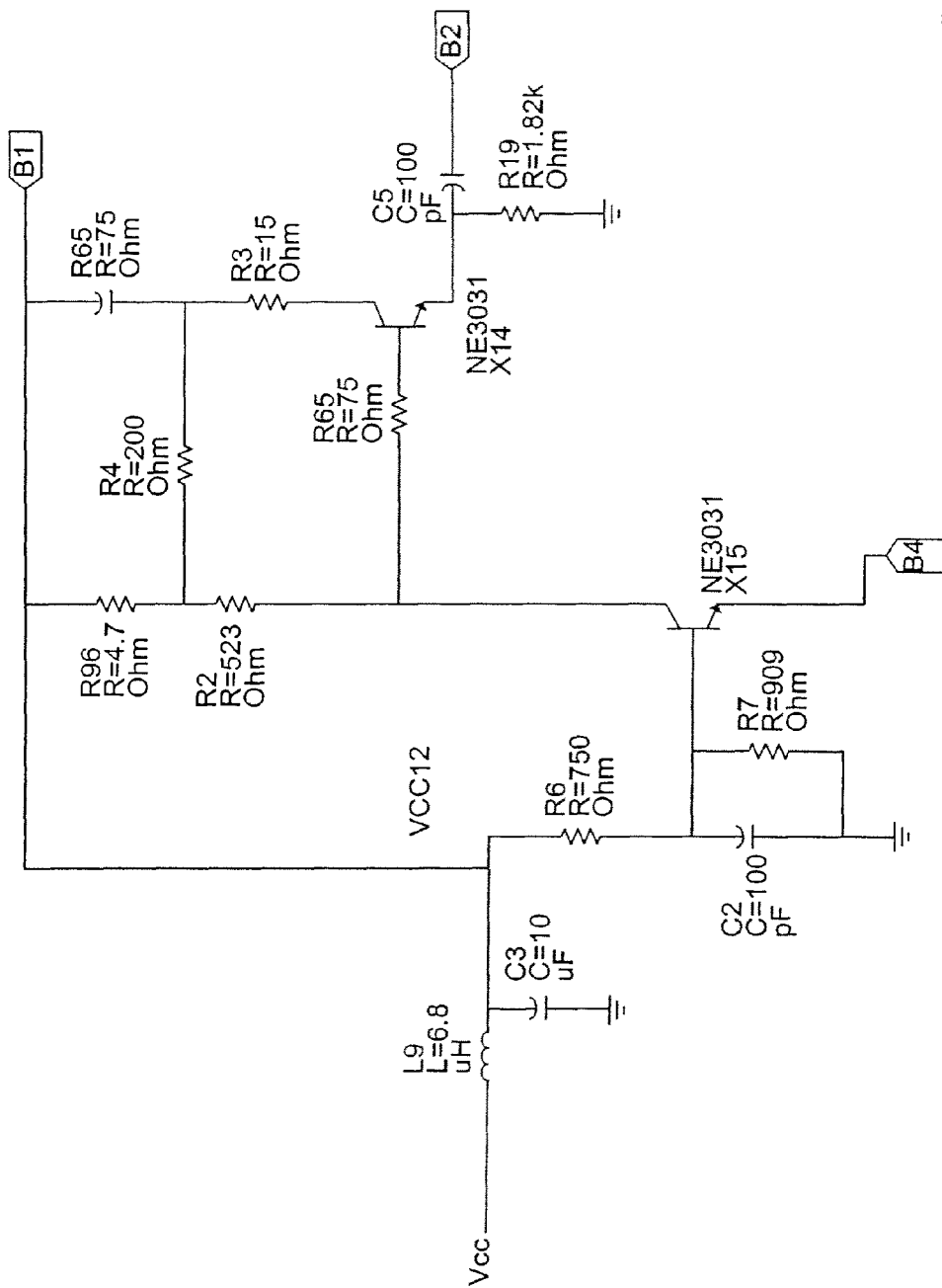
Figure 12-E
SENSOR COUPLING / VOLTAGE CONVERSION 1200

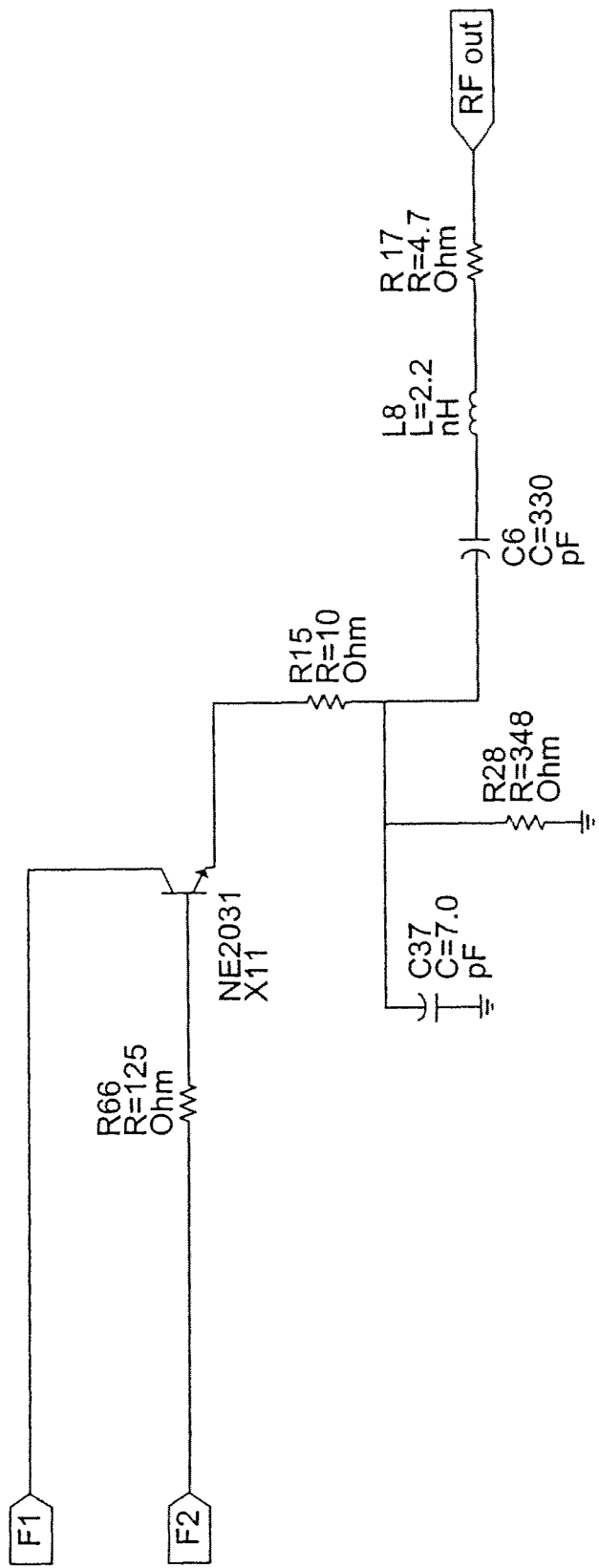
Figure 12-F
IMPEDANCE MATCHING 1600

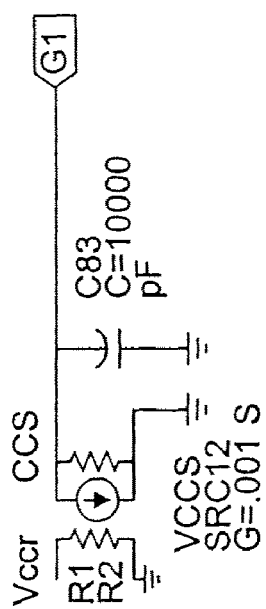
Figure 12-G
VCCS 1800

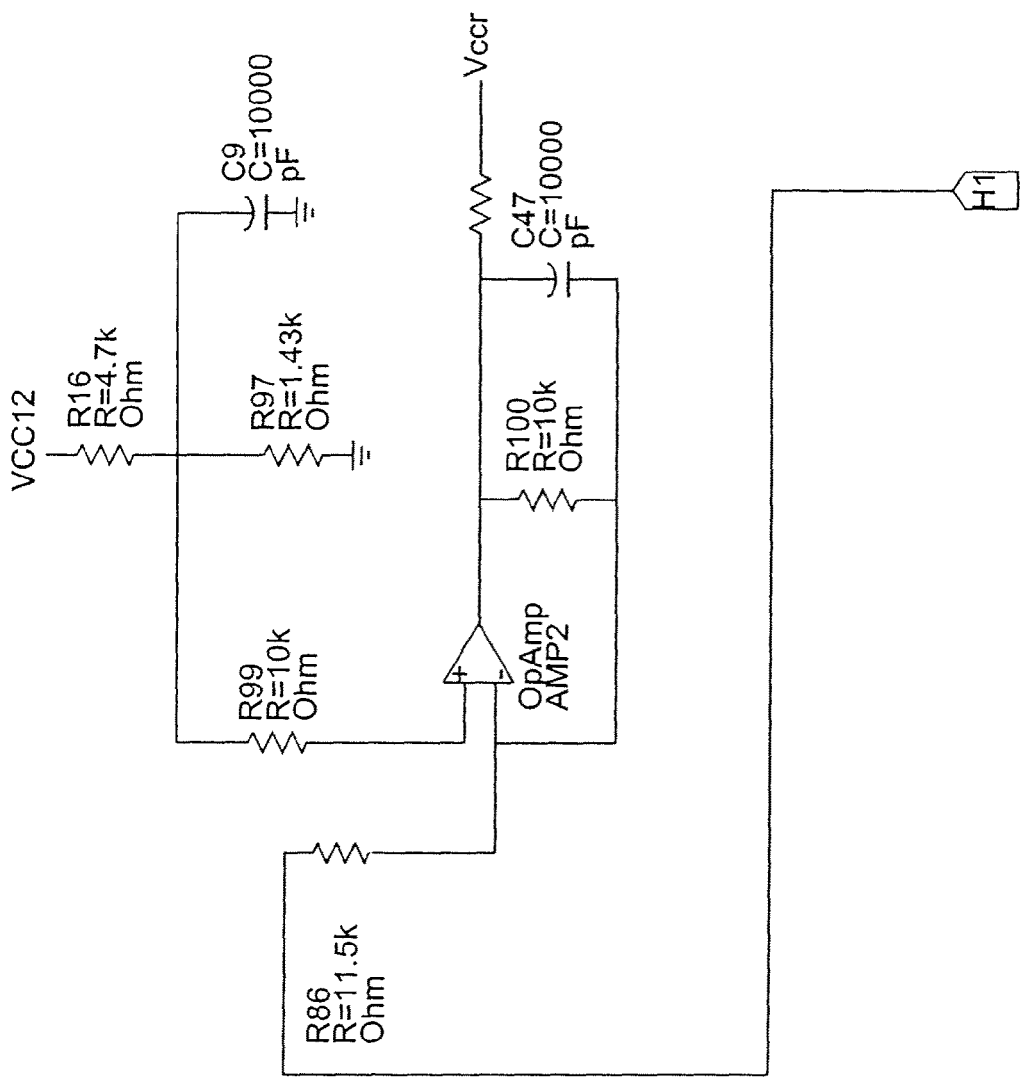
Figure 12-H
VCCS CONTROL 1700

LINEARIZED TRANS-IMPEDANCE AMPLIFIERS

PRIORITY INFORMATION

The present application is a continuation of U.S. application Ser. No. 12/043,299 filed 6 Mar. 2008, which is a continuation of Ser. No. 10/993,969 filed 19 Nov. 2004, which claims priority under 35 U.S.C. §119 (e) of U.S. Provisional Patent Application No. 60/527,587 filed 5 Dec. 2003; the entire contents of all of which applications are incorporated herein by reference.

STATEMENT PURSUANT TO 37 CFR §1.71(E)

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE DISCLOSURE

The present disclosure relates to circuits for the recovery and amplification of low amplitude analog and digital signals. The disclosure further relates to circuits used for the recovery and amplification of analog and digital signals modulated onto carriers and transmitted via optical fiber or free-space transceivers, and to an advanced linearized trans-impedance amplifier (ATIA) that allows for the recovery and amplification of low amplitude analog and digital signals.

BACKGROUND OF THE DISCLOSURE

Pronounced as "coming soon" for over a decade, the ability to run "last mile" fiber optic cables for communications and data transfer has never actually materialized except in limited field tests. The slow deployment owes to the high component and system costs due to both expensive manufacturing/design techniques and inadequate component performance. Thus, a technically feasible albeit brute force solution has failed to be implemented in the face of economic realities.

Past and present attempts to implement a complete fiber optic network are best summarized as follows:

Initial optical fiber deployments were initially limited to the major "trunk lines" connecting large populations and data sources due to costs for buying, laying, and connecting the fiber to the existing communications infrastructure.

Follow-on deployments saw fiber optic cables extended from these major access points outward to local distribution points, but still not to each individual household.

At present, the industry has used a Passive Optical Network (PON) design which has enabled the amortization of the cost of the expensive optics at the Optical Line Termination (OLT) over several homes, but the number of optical signal splits are limited by the need to deliver Analog Video services over the fiber. The ability to deliver analog video services is required if the optical fiber systems is to compete with the existing cable TV infrastructure.

Pundits and futurists have cited several uses for the impressive data transmission capacity inherent in fiber optic based systems if such a system were broadly deployed all the way to the end user. However, none has proven to be a compelling business market due to present day economics of the required infrastructure. Such things as real time streaming digital video delivered on demand could have a pronounced ability to change or open new markets if only a technical solution could be cost effectively delivered.

Major issues confronting the delivery of these services of a fiber delivery based system include:

Cost of deployment vs return on investment (ROI),

Bandwidth limitations due to passive loss and dispersion in the optical path, and Number of customers served on a PON due to Analog receiver sensitivity vs carrier to noise ratio (CNR).

Thus, there is a need in the art for systems and methods through which service providers may deploy low cost fiber systems for the mass delivery of the broadband services that the end users desire.

One stumbling block to the deployment of fiber to the home has been lowering the cost of an optical network termination (ONT) in a customer's house. FIG. 3 shows an example of an optical network topology using both powered and passive optical components. One ONT is required at each termination, as shown by the houses in the drawing. FIG. 4 shows a more detailed view of an example termination at a house, with the ONT clearly shown. The ONT in this example includes several parts: an optical receiver, a wavelength-division-multi/demultiplexer (WDM) transceiver module to split a multiplexed signal into discrete channels, interface circuits to the customer terminals, and optionally, a power supply and battery. Typically, the optical receiver is integrated with the WDM transceiver as a single field replaceable optical WDM transceiver module. The module provides a complete interface between the optical transmission world and the electrical transmission world in a single package.

Optical receivers for light guide systems of the type employed in cable systems generally use a high frequency photodiode to convert the light signal to a photocurrent. The photocurrent is proportional to the received intensity of the light signals, and then applies the resulting current to an input circuit.

Since the current obtained from the sensor circuit is often too small to be usefully applied to data recovery circuits, it is desirable to amplify the sensor's photocurrent signal in order to make it relatively insensitive to the introduction of ambient noise during signal processing stages. To this end, optical receivers include a so-called "front end" trans-impedance amplifier (TIA) which raises the level of the signal several orders of magnitude. The output of the front end is then further amplified and shaped in a later section of the signal processing system.

It is desirable for an optical receiver to have a wide dynamic range, both in input intensity and for input frequency. The reasons a wide dynamic range of input intensities is desirable include (1) variations in the assorted cable lengths and multiple types of light sources with which the optical receiver may be used; and (2) variations in light attenuation that can occur with variations in cable lengths, all of which has an effect on light intensity output. However, since the light signals may have significant variations in intensity, resulting in a wide range of input currents, the amplification circuits need to be capable of handling a wide dynamic range of input currents depending on the strength of the received light signal. The received signal strength will vary, for example, as a function of distance from the transmitter, quality of circuit components, number of passive splits, etc. In most cases, the receiving system has no prior knowledge of its distance from the transmitter and topology and it is therefore important that any designs have the flexibility to accommodate the full range of input signal strengths.

An optical receiver with a wide dynamic range of input frequencies may handle additional channels within a multiplexed signal, or may support higher data rates. A limiting factor in the optical receiver's dynamic range is the dynamic range of the trans-impedance amplifier, which is in turn limited by factors such as components selected, the circuit design, and the ambient noise introduced by various circuit components. One such limiting factor is the use of feedback designs, which limit the overall dynamic range of the circuit by introducing stabilization timing constraints within the feedback loop.

In general, analog video delivery over fiber is widely used in the CATV industry to distribute video service between Head-ends, Hubs and Nodes. As such, it would seem to be a normal evolution of system design to extend the distribution of this type of video to the home over a PON system using part of the 1550 nm band.

Today, state of the art video receiver designs allow the ONT/Home Gateway to receive a video signal as low as −6 dBm while still maintaining acceptable CNR and distortion performance over the specified range of received input power. Although this gives performance levels that approach today's cable equivalent, it does come with a price.

Currently, optical video receivers do not use the same method of coupling or signal recovery for analog video transmissions as those used for digital signal transmissions. Digital systems use a high gain Trans-Impedance Amplifier which provides good noise performance but poor linearity for the number of signal channels needed (79 NTSC channels) to satisfy minimum expectations. To effectively compete with the CATV market, an additional 30 or more digital channels will be required to be transmitted above 550 MHz, the current limit.

One of the most efficient designs currently available uses a transformer coupling that matches the amplifier input impedance to the coupling resistor in series with the Photo-Diode as shown in FIG. 2. This type of receiver provides good performance for both CNR (about 48 dB) and Intermod-Distortion (approximately 0 to −5 dBm); and there is an inherent loss due to a maximum power transfer of approximately 3 dB. This loss could be decreased by coupling the current directly in to the amplifier, but linearity then becomes a greater concern at the higher levels in received optical power.

It is additionally desirable to limit the amount of noise introduced into the sensor circuit by the "front-end". Limiting the amount of introduced noise permits the circuit to operate at lower power and with higher responsiveness, providing advantages such as more efficient signal recovery, reduced operating costs, less heat dissipation, and improved dynamic range.

It will be appreciated that improvements in the art described in the present disclosure that satisfy the above requirements will find use in other fields in which it is necessary to recover a low power signal from a carrier signal, or to amplify a low power signal for further processing.

SUMMARY OF THE DISCLOSURE

The following discussion of advantages is not intended to limit the scope of the invention, nor to suggest that every form of the invention will have all of the following advantages. As will be seen from the remainder of this disclosure, the present invention provides a variety of features. These can be used in different combinations. The different combinations are referred to as embodiments. Most embodiments will not include all of the disclosed features. Some simple embodiments can include a very limited selection of these features. Those embodiments may have only one or a few of the advantages described below. Other preferred embodiments will combine more of these features, and will reflect more of the following advantages. Particularly preferred embodiments, that incorporate many of these features, will have most if not all of these advantages. Moreover, additional advantages, not disclosed herein, that are inherent in certain embodiments of the invention, will become apparent to those who practice or carefully consider the invention.

One advantage of the presently disclosed apparatus and method over existing apparatus and methods is the reduction in paid-in dollars/milli-watt of optical power generated at the Head-end or central office (CO) due to the use of high power Erbium doped fiber amplifiers (EDFAs) at the Hub or Head-end for distribution of the 1550 nm video signal. By increasing the sensitivity of the video receiver without severe degradation of the CNR and distortion performance, the present apparatus and method lower the cost of the video distribution by either allowing a decrease in EDFA output power or an increase in homes passed per high power EDFA.

In a second advantage, the disclosed apparatus and method will allow the integration of the analog receiver function into a package with a photo diode for better control of the RF matching and coupling. This will increase the performance of the analog optical receivers, allowing longer reaches, lower EDFA output power, and the distribution of the signal to more end users. In general, this has the effect of reducing the amount of optical power needed for signal distribution in networks or allowing for an increase in the potential revenue for dollars spent on the generation of the optical signal in existing infrastructures.

Eventual integration of this technology into silicon optical bench or other semiconductor processes that can also be used to fabricate lasers and photodiodes will allow smaller, lower power components enabling further applications which could include delivery of voice, data video services to a PC, home Entertainment Centers, Flat panel TV's, High speed internet Gaming devices, etc.

Further advantages of several other embodiments of the disclosed apparatus and method include:

Greater linearity, resulting in lower harmonic noise introduced into the circuit, Greater amplification of low level signals while maintaining superior CNR and Distortion performance, Increased dynamic range of Analog Fiber Optic Receivers by at least 3 dB-6 dB, Reduced component count, Decreased size of the Analog Receivers, Eliminates the use of passive components such RF transformers for coupling, Reduced energy dissipation, permitting more efficient packaging and reduced manufacturing costs, Allows for the placement of the amplifying device in the same package as the Photodiode and optics used to couple the light to the photodiode, and Provides the technology for Analog Video that would allow the ATIA receiver and Photodiode to be fabricated as a single device.

A primary advantage of the disclosed ATIA is that it provides a simple circuit implementation that achieves the desired goals of: a) operating with a low input bias current; b) wideband normalization of the input signal; c) fast overload recovery; d) good accuracy for DC and wideband signals; e) simple implementation of automatic gain control; and f) stability for a wide range of input conditions.

The disclosed ATIA is a circuit that has both high current gain and excellent linear properties to enable the recovery of extremely low-level analog signals modulated upon a carrier signal beyond the capabilities of other circuits here-to-for discussed. Along with high gain and low noise characteristics, feed forward gain control techniques provide for use of the circuit as a Trans-Impedance Amplifier (TIA) with improved response and dynamic range. This circuit can be used within the Audio (10 Hz) to Microwave (10 GHz) frequency range.

In an example of one preferred embodiment an ATIA with automatic feed-forward gain control (AFFGC) includes an optical (photo-diode) sensor. An alternative preferred embodiment provides further reduced noise and increased linearity by stabilizing the sensor photo-diode coupling stage bias current. Stabilizing the bias current through the transistors in the first coupling stage improves upon both input-referred noise or equivalent input noise (EIN) and linearity of the transistors in this stage when operating at the higher input optical powers. This improvement can be quantified as an increase in the dynamic range of the ATIA by 2 dB (from −1 dBm to +1 dBm of optical input power). This is achieved because the bias control keeps the transistors in their most linear region throughout the input range of the ATIA. The improvement in noise is achieved by limiting the bias current through the transistors when the optical input power reaches −3 dBm to +1 dBm.

In an alternative preferred embodiment, the basic ATIA with AFFGC circuit disclosed herein is changed only in the fact that there is DC feedback to the emitter of the first transistor of the sensor coupling block. Additional (optional) circuit blocks named "VCCS Control" and "VCCS" are added to provide this feedback. This circuit is shown in FIG. 12 and is described hereinafter. It will be appreciated that bias current stabilization as described herein allows this type of coupling to be used with Field Effect Transistors (FETS).

An additional benefit of the alternative preferred embodiment shown in the circuit diagram in FIG. 12 is the same for the different process technologies as it is for a bipolar junction transistor process. It enables the devices to reflect a lower Equivalent Input Noise (EIN) over other approaches by eliminating the extra noise reflected to the base/gate of the first transistor of the coupling stage and creates a much lower apparent input resistance for the additional sensor current caused by the DC component of the optical signal applied to the sensor. An added benefit is the removal a linear component (resistor) to generate the AC voltage needed to couple in to a base or gate of the first stage transistor of the TIA or amplifier. This additional component has both the AC and DC currents from the sensor passing through it creating more input noise which cannot be eliminated using the accepted coupling technique, its elimination reduces the input noise associated with this component.

The foregoing and other benefits are achieved by the apparatus and methods described herein which overcome problems inherent in systems employing optical transmission techniques which include, but are not limited to, optical networks using distribution methods with large amounts of passive coupling loss or through air optical transmission. Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The disclosed apparatus and method are described in detail with reference to the accompanying drawings. Each of the figures is a schematic diagram more fully described below.

FIGS. 10a and 10b show block diagrams of common receiver modules using a preferred embodiment of the disclosed apparatus.

DETAILED DESCRIPTION OF PREFERRED EMBODIMENTS

In regards to communications networks and distribution schemes in general, multiple disparate systems have been created in order to supply data and other communication services to end-users. As such, a typical home will have to incorporate multiple receivers in order to accommodate the receipt and/or transmission of data for each of these different systems. These systems can include phone and fax services, analog and digital, one-way and two-way video services, IP-based data services, etc.

With the use of an advanced ATIA, multiple types of services can be offered at a cost competitive rate with other delivery mechanisms using a single unified delivery system. This unified delivery system will most likely support a mixture of:

45-862 MHz one-way cable television.

5-65/85-862 MHz full duplex cable television, permitting the use of DOCSIS compliant cable modems. DOCSIS is the ITU endorsed "data over cable systems interface standard" as defined by US based Cable labs. The service also supports the DVB based Euromodems, legacy IEEE 802.7 based equipment for sub-split networks, and RF modems for video on demand (VOD) applications and the likes.

10/100/1000 Mbps full duplex Ethernet (10/100/1000 BaseT).

Plain old telephone services (POTS).

Integrated services digital network, basic rate interface (ISDN-BRI).

Integrated services digital network, primary rate interface (ISDN-PRI).

Data interface for residential alarm panel or telemetry.

Digital and/or analog audio data.

To overcome the problems which have up until now prevented the adoption of fiber to the end user, the disclosed apparatus and method:

Offer a more sensitive Analog Video receiver technology to maintain good CNR.

Provide optical modulation techniques for data transmission similar to DSL to enable greater distances from the OLT and increased Tx to Rx optical split ratio.

Affords Digital Video Transceivers for both OLT and ONT applications.

Figure 1:
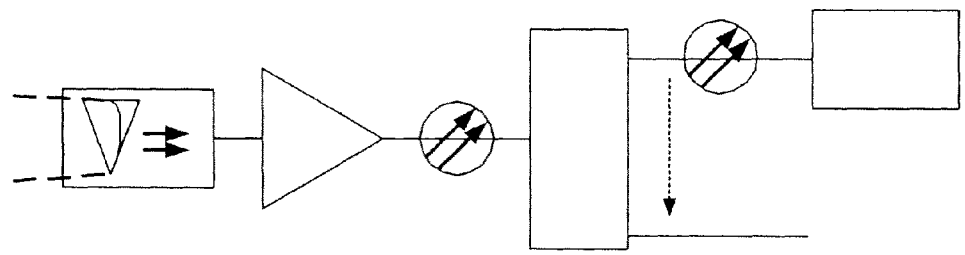
FIG. 1 shows a video signal transmissions in a typical passive optical network (PON) which can be used to deliver voice, data and video to an end user.
Figure 2:
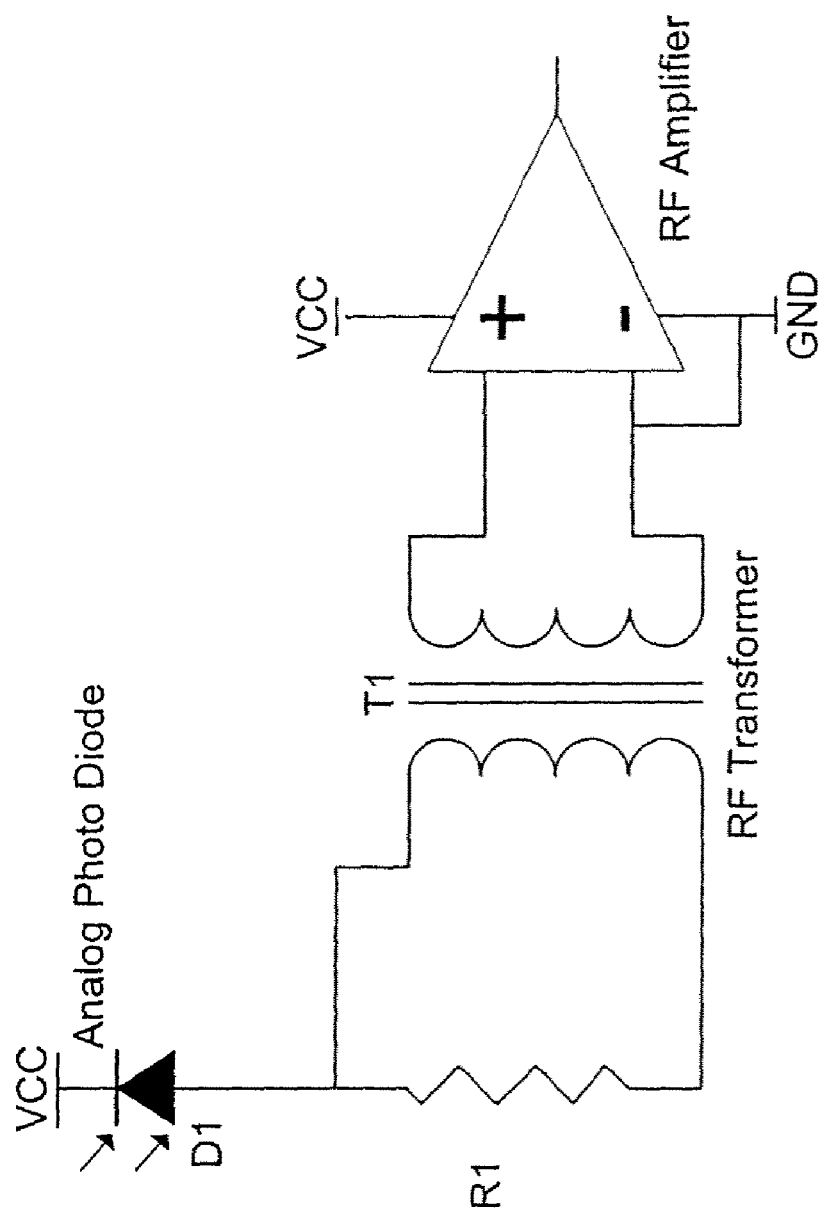
FIG. 2 shows the typical circuit topology and design currently used in analog video recovery in cable TV (CATV) and Fiber-to-the-Home (FTTH) optical networking components.
Figure 3:
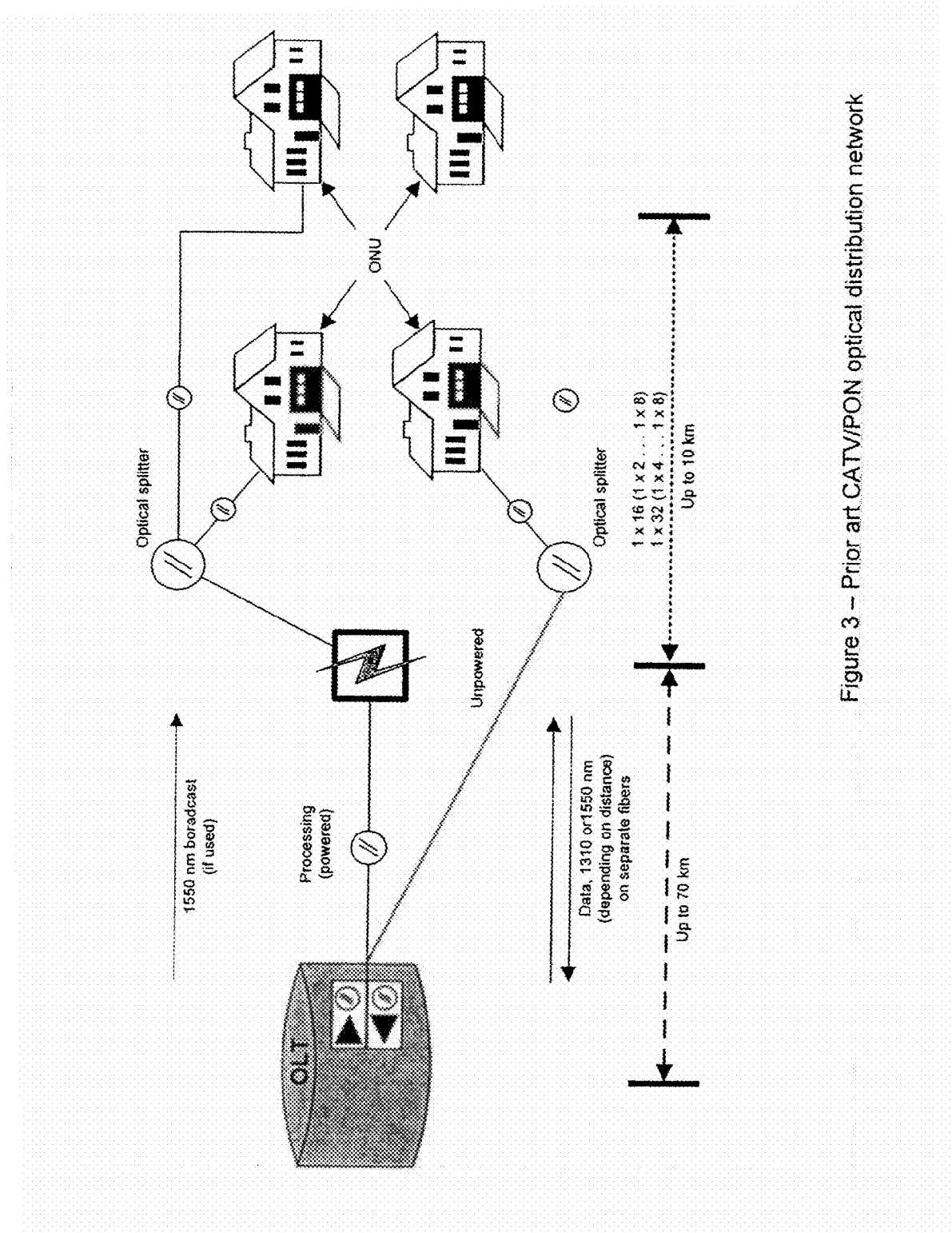
FIG. 3 represents an example of a network architecture for connecting homes (end-users) to the fiber optic network using the teachings of the present disclosure.
Figure 4:
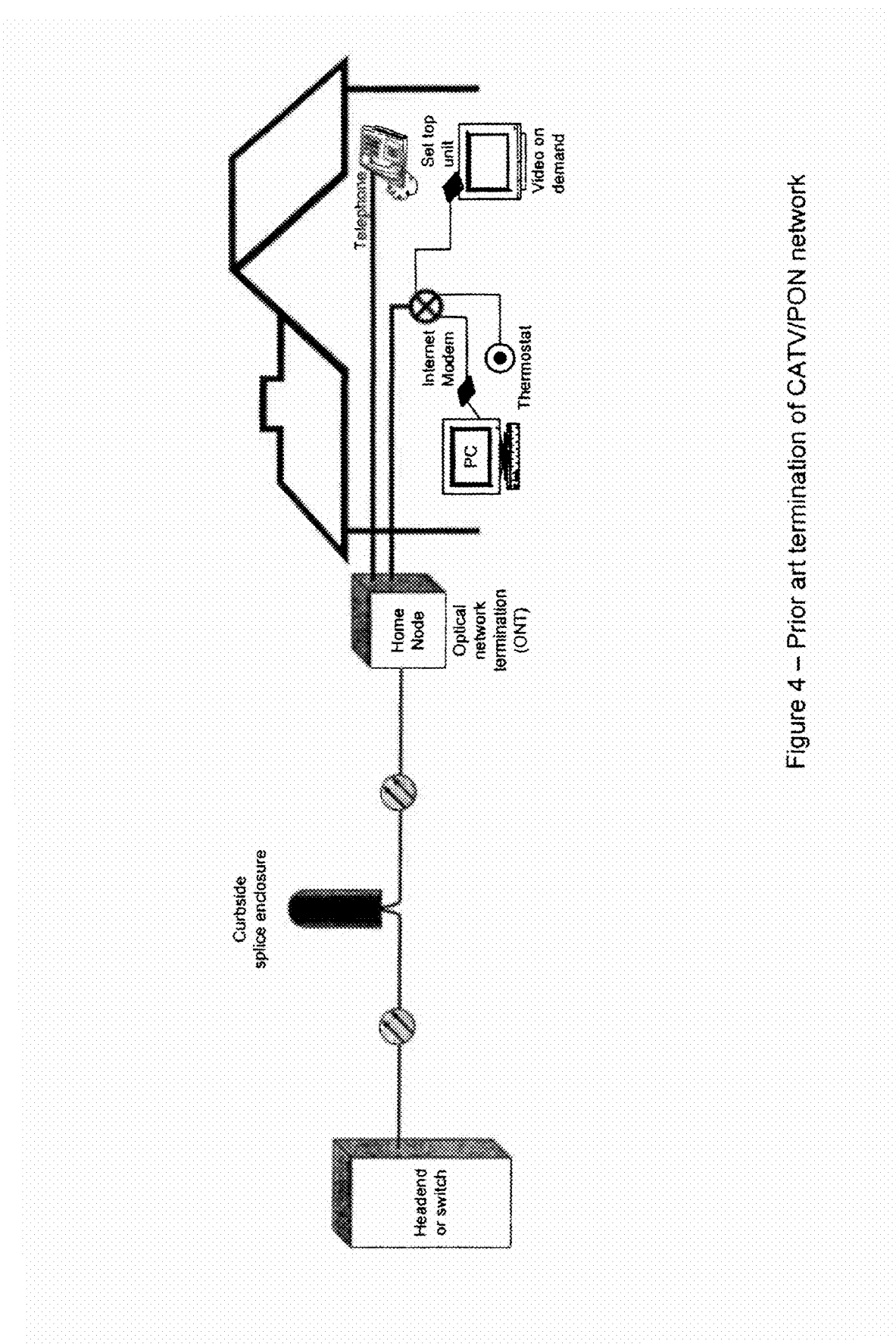
FIG. 4 is a further schematic of the fiber optic link into the home using the teachings of the present disclosure.
Figure 5:
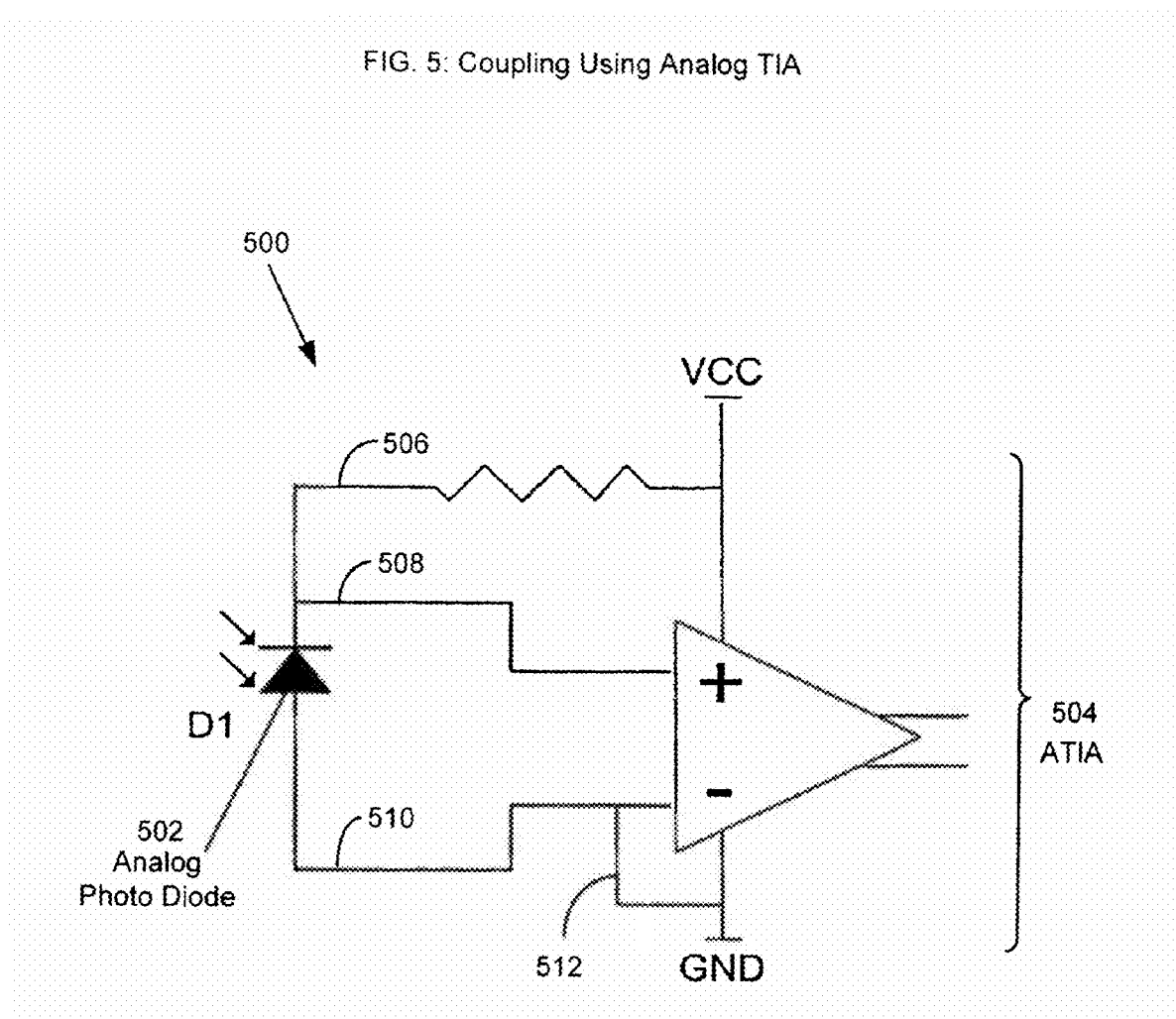
FIG. 5 shows the preferred coupling technique in accordance with the teachings of the present disclosure, the technique providing excellent noise performance without the coupling losses, but is inherently non linear with regard to traditional trans-impedance amplifier (TIA) and coupling approaches.
Figure 11:
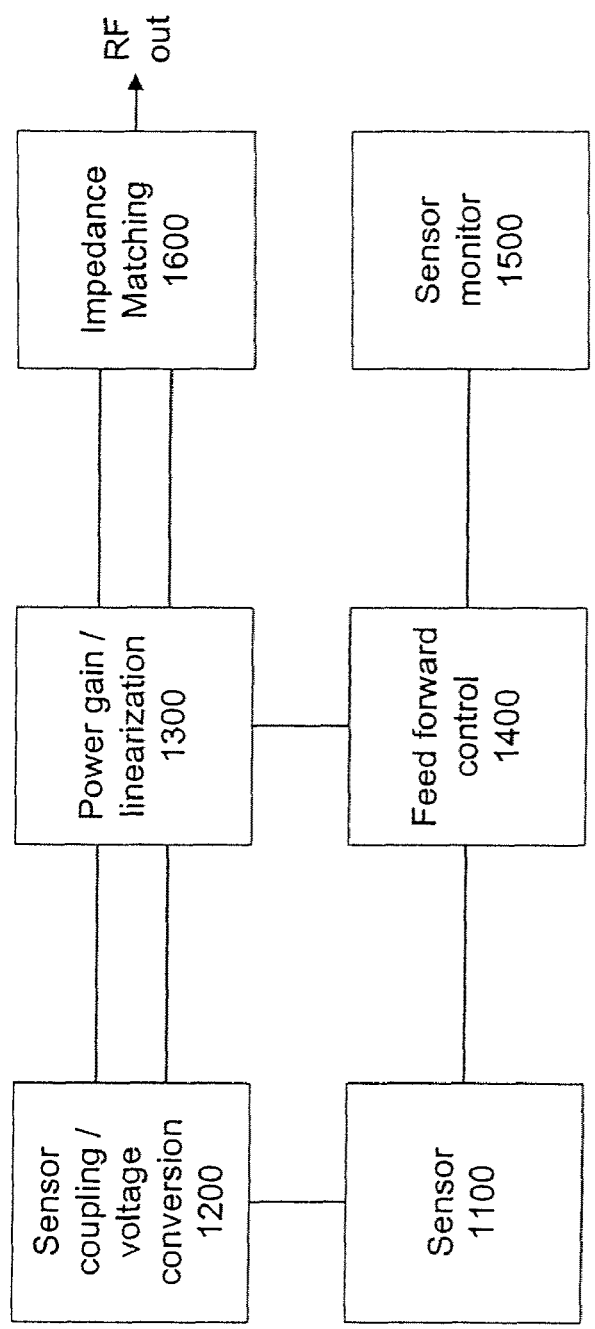
FIG. 11 is a schematic of a preferred embodiment of a basic ATIA circuit, including a photo-diode sensor.
Figure 12:
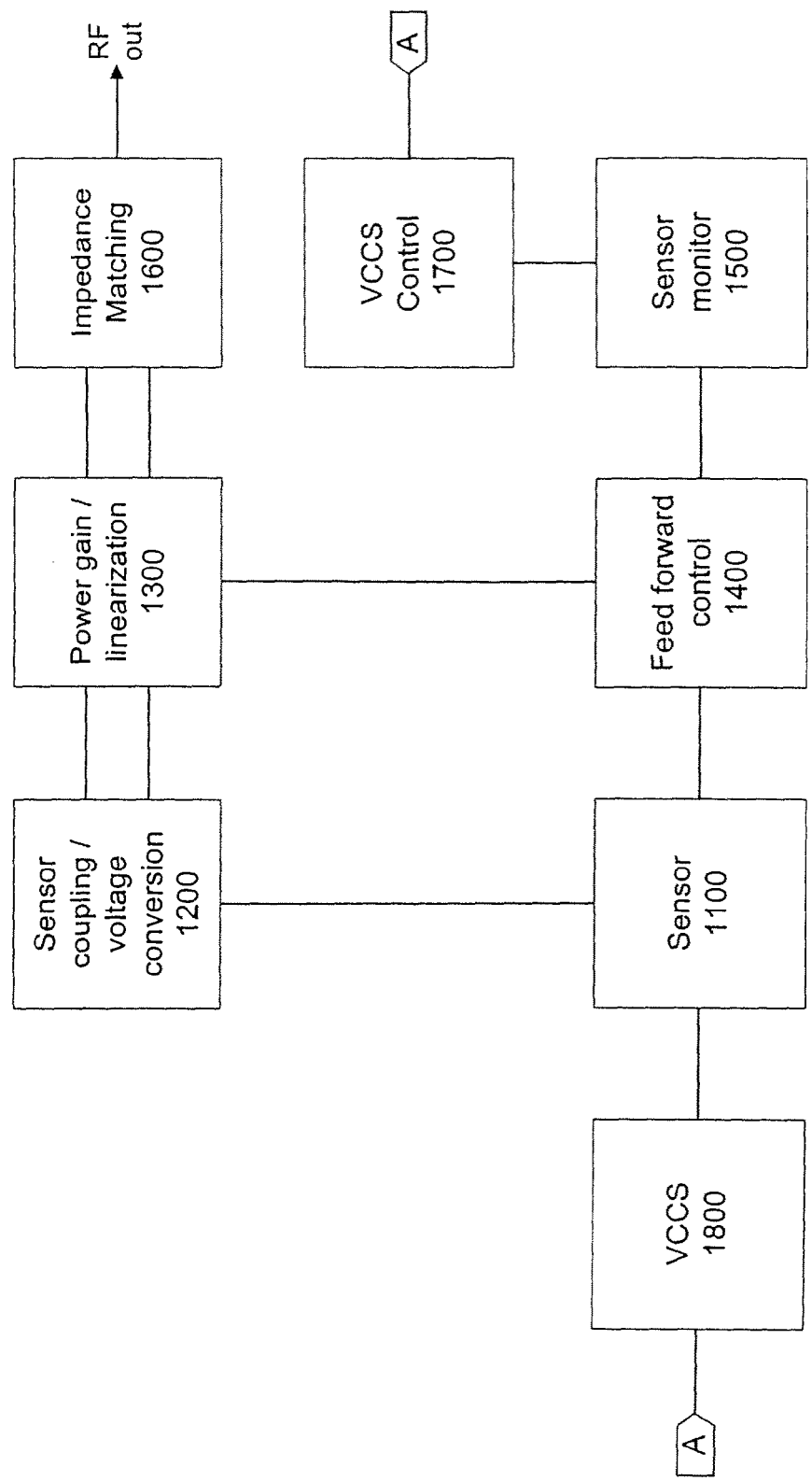
FIG. 12 is a schematic of an alternative preferred embodiment of an ATIA circuit with optional bias control, including a photo-diode sensor.

In a preferred embodiment, shown generally in FIG. 5, and in more detail in FIGS. 11 and 12, the disclosed coupling of a photo-diode sensor to the amplification stage provides significant benefits. By using a low noise process such as SiGe and an ATIA, the noise contribution of the amplification circuits can be kept low. This allows the recovery of the lower level signal while maintaining a respectable CNR, and eliminating the coupling losses due to the impedance matching circuit.

To help improve linearity and save in device power consumption, pre-distortion techniques can be used by designing a pre-amplifier and post amplifier stage with equal and opposite, or complementary distortion characteristics. As seem from the functional diagram of the Analog TIA (ATIA) shown in FIG. 7, this will allow higher gains to be achieved improving further in the sensitivity of the Video Receiver.

Figure 9:
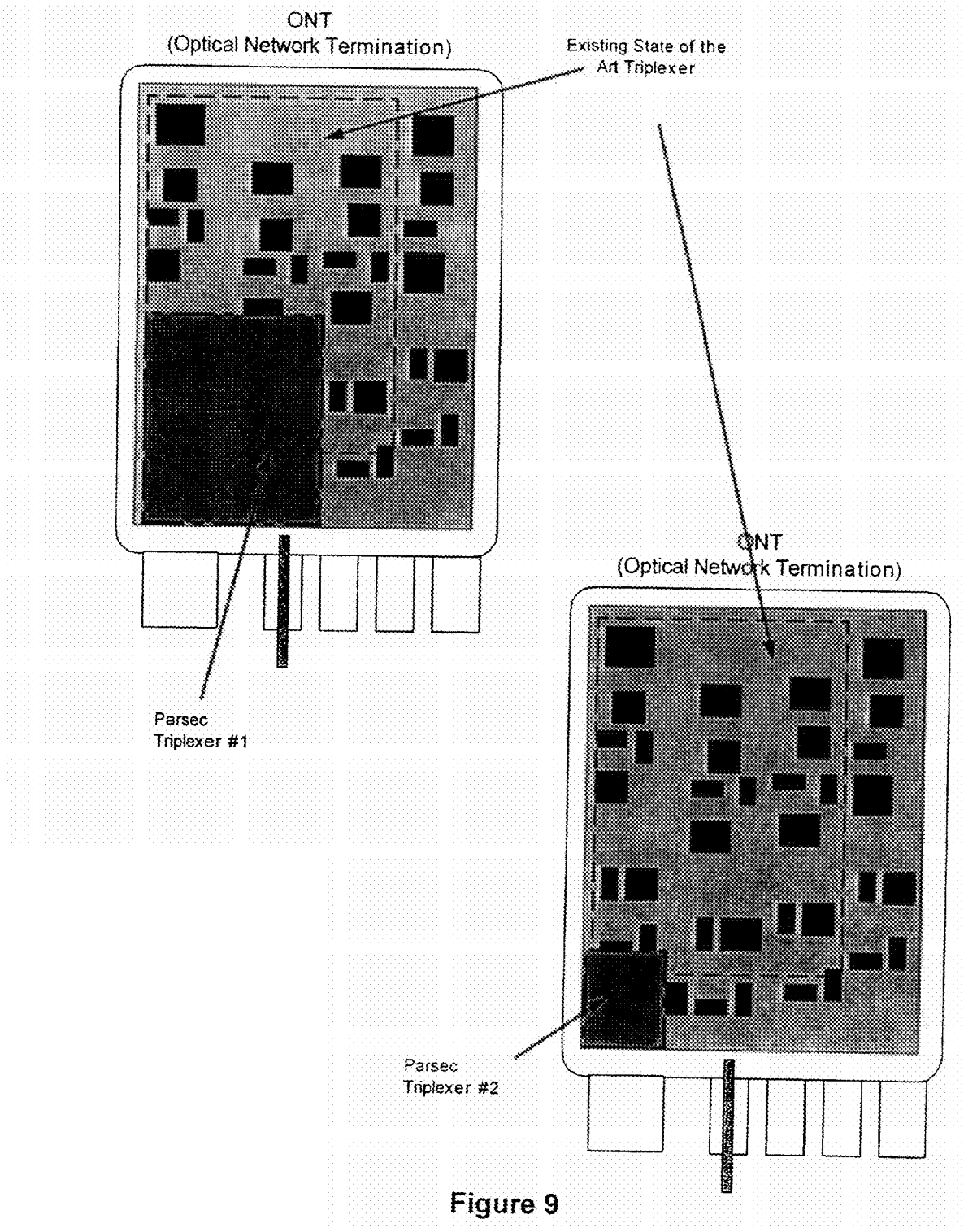
FIG. 9 details the reduction in size and component count within a module which will be afforded through the incorporation of disclosed apparatus as compared to the current state of the art.

The design of a preferred embodiment provides significant cost and space savings, including the integration of the optical components within a single die. This substantially reduces the cost, power consumption, and size of the resulting module. FIG. 9 illustrates the substantial size reduction afforded by this integration, first by reducing the ATIA/coupling interface to a single die (Triplexor #1), and second by reducing the entire triplexor circuit to a single die (Triplexor #2).

Figure 6:
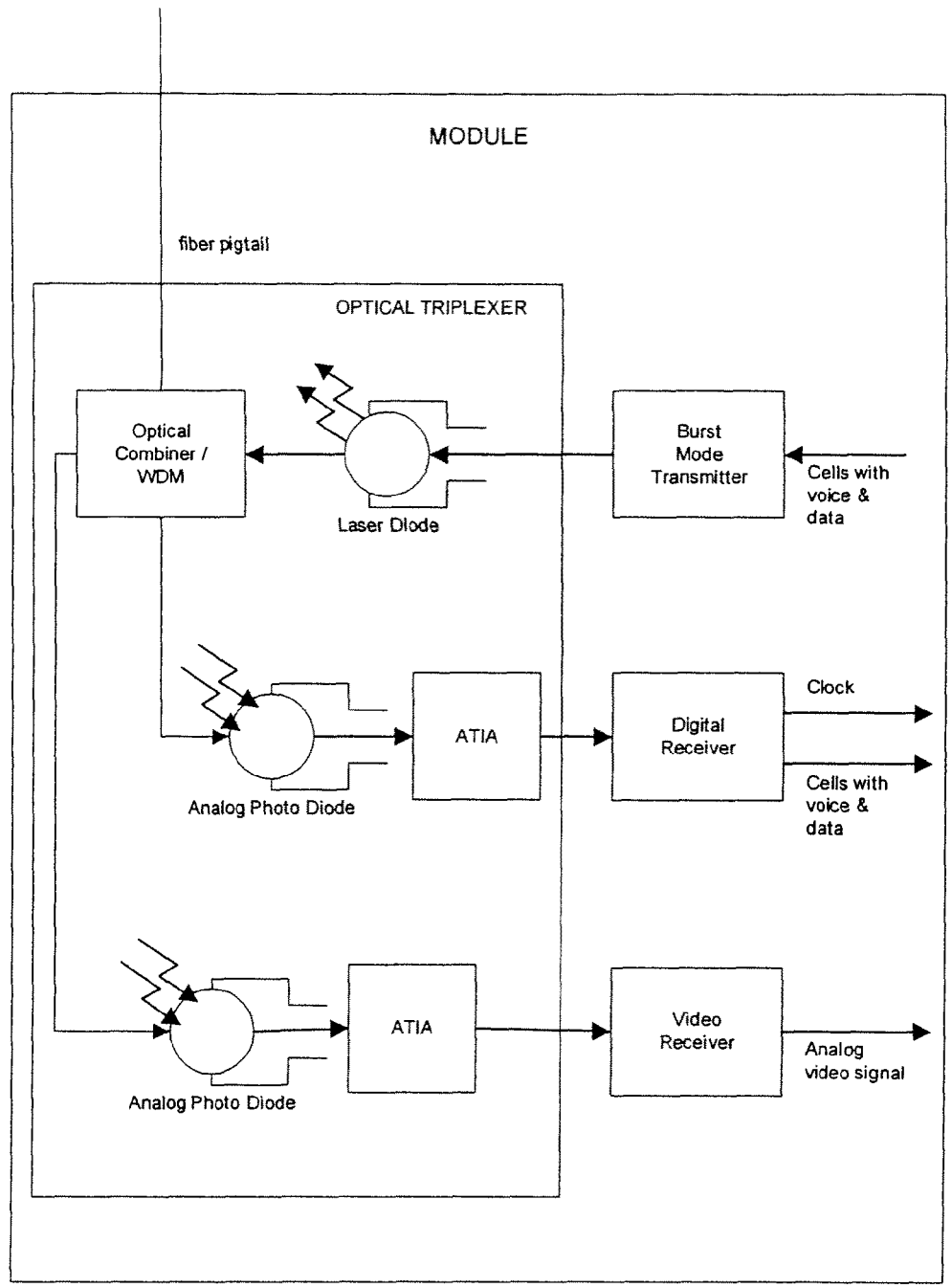
FIG. 6 is a block diagram of an Optical Triceiver that uses the linearized TIA technology described in the present disclosure to recover Broadcast Video signals transmitted in FTTx systems.

This approach enables the integration of several different functions used in Passive Optical Network data voice and video transmission. An example of this using a disclosed embodiment within an industry standard optical triplexor and ONT module is shown in FIG. 6. Other examples of industry standard module configurations using a disclosed embodiment are shown in the block diagrams in FIGS. 10a and 10b. In FIG. 10a, a unidirectional module is shown in which the module operates in a receive-only mode such as with today's CATV systems. In this example, the optical signal is received at the optical splitter, and is routed to two different ATIA circuits based in part upon wavelength or frequency considerations. In FIG. 10b, an alternate module configuration is shown in which the ATIA is integrated within the optical transceiver and video receiver components and the ATIA is not provided as a separate circuit within the module.

The frequency range of operation of the disclosed ATIA is determined in part by the type of sensor selected, the silicon technology employed in the design and fabrication of this circuit and the values of components as described in figures. The components described herein are optimized for use within the preferred embodiment of an optical receiver and provide optimum response in the frequency range of 25 Mhz to 2 GHz. It will be appreciated by those skilled in the art that the circuit design will provide the best response within the 10 Hz to 10 Ghz operating range by optimizing the values of various resistors.

The ATIA of the present disclosure has the following advantages:

Provides highly efficient current to voltage conversion from sensor to RF amplifiers—Achieved with fabricating IC's using low noise high frequencies processes that enable direct conversion of sensor output to voltage.

Provides direct control of gain by using the average optical power level to the receiver to control gain and noise cancellation in converter.

Allows ICs and sensors to be combined in the same package so as to reduce parasitic induced noise currents.

Allows IC's and sensor components to be fabricated as one piece of silicon. Use of noise and distortion reduction techniques results in increased receiver linearity.

Figure 7:
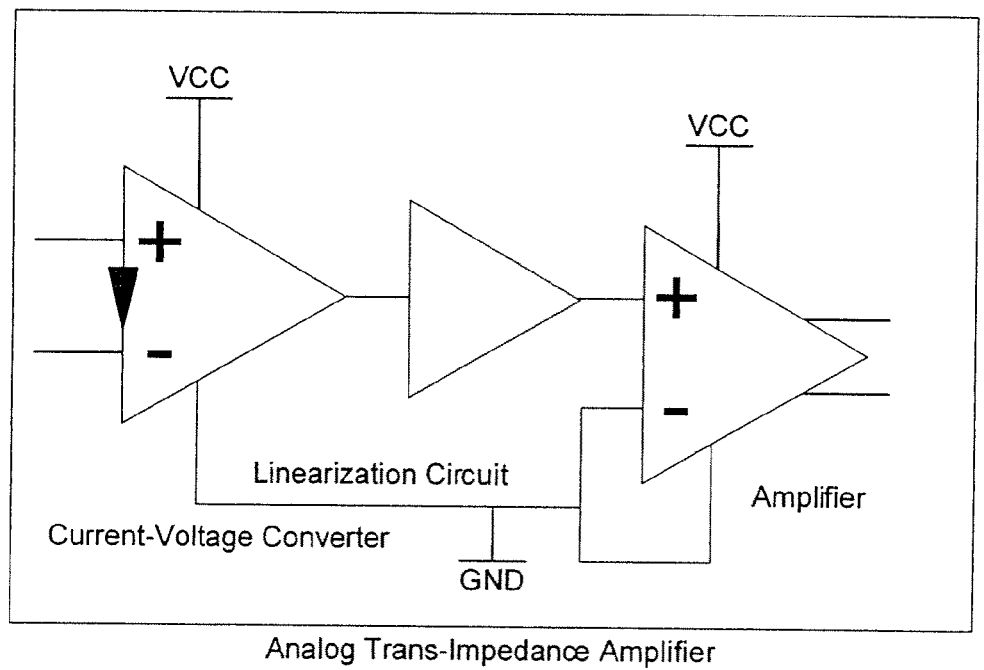
FIG. 7 is a block diagram of an analog TIA using a specific linearized design approach which reduces the inherent non-linearity's of the TIA enabling the use of the preferred coupling technique of FIG. 3.

FIG. 7 contains a functional diagram of this concept, which first will be developed as a chipset and eventually integrated into a single chip for integration onto silicon optical bench technologies and eventually fabricated with the optical components such as lasers and photodiodes used in the 600 nm-1700 nm range.

The disclosed ATIA can be produced using various manufacturing processes and materials, including the following:

Heterojunction Bipolar Transistors (HBT).

Field Effect Transistor (FET) technologies, including but not limited to GaAs, CMOS, BiCMOS, InGaAsPh, and InPh.

SiGe.

The choice of manufacturing process is dependent on the specifications required to be implemented, costs, and delivery time.

The disclosed ATIA is logically and preferably (although not necessarily) divided into three stages with defined attributes. These stages include:

Coupling stage—Preferably uses dynamic impedance of the sensor for input power detection, gain control and amplifier stabilization—Preferably does not require RF impedance matching which eliminates the matching power losses due to the need for input mismatching to achieve low noise figure in the amplifier.

Linearization Stage—Preferably uses special biasing techniques for the components to achieve desired function—Preferably uses both active and passive components to get complex conjugate functions—Preferably employs both non linear distortion and Complex Conjugate matching to reduce both Inter-modulation Distortion, non-linear amplifier distortion Composite Second Order and Composite Third Order Distortion.

Amplifier Stage—Preferably uses special biasing techniques to achieve the conjugate function of the linearization stage and reduce power consumption—Preferably uses both active and passive components to get complex conjugate functions—Preferably employs both non linear distortion and Complex Conjugate matching to reduce both Inter-modulation Distortion, non-linear amplifier distortion Composite Second Order and Composite Third Order Distortion when paired with the linearization stage.

One of the many uses of an ATIA of type described herein is for recovering signals that require high carrier/channel content such as CATV or Satellite TV. Due to the inherent non-linearity and bandwidth of the amplification circuits used for current amplification of the photodiode within the CATV industry, TIA's have never before been considered for this use. Additionally, in the preferred embodiment, the ATIA of the type described herein uses the dynamic impedance of the photodiode sensor as part of the amplifier feed forward circuit, which in turn provides the ability to exercise discrete control over several functions including optical input power detection, gain control, and amplifier stabilization.

Further, the ATIA detailed within the preferred embodiment preferably uses a three stage approach to provide linearization with regard to it's input/output transfer characteristics. More specifically, the ATIA uses a pre-amp stage with gain control, a pre-distortion stage, and a post-distortion stage with complex conjugate matching and gain control. This approach takes into account the noise and non-linear properties of (1) the fiber, (2) the photodiodes that are used as sensors, e.g., Indium Gallium Arsenide/Indium Gallium Arsenide Phosphide (InGaAs/InGaAsP) photodiodes, and (3) the semiconductor process used for manufacturing the amplification stage so as to construct a linearization circuit that can be used for high carrier/channel content applications requiring, for example, optical input powers of −9 to −12 dBm and requiring a CNR performance of 46-50 dB and composite second order (CSO) and composite triple beat (CTB) of −56 to −60 dB.

One application of such a circuit is in the recovery of multiple RF carrier signals transmitted over optical fiber. In a preferred embodiment, the signal is modulated using a 1260-1650 nm laser or LED light source. These sources can be either provide direct or external modulation. Each modulated signal can have 1-200 plus carrier signals, which require highly linear, high gain, low noise circuits for proper signal recovery. This type of transmission of signals is useful in several different end-use applications. An example of one such application is where the signal is transmitted as part of a fiber-to-the-premise (FTTP) system as a broadcast video overlay which transmits the signal using 1550-1600 nm modulation. In an alternative application the signal is transmitted through a CATV system in conjunction with broadcast video signals using 1260-1600 nm modulation. In another example, the signal may be used in a satellite antenna remote application of Ku, C and L band signals using 1260-1600 nm modulation.

Referring to FIG. 6, an ATIA with automatic feed forward gain control 1000 (ATIA with AFFGC) comprises a plurality of sub-circuit blocks, with additional optional sub-circuits that enable additional features relating to the disclosed apparatus and method. These sub-circuits are referred to as functional blocks.

Figure 8:
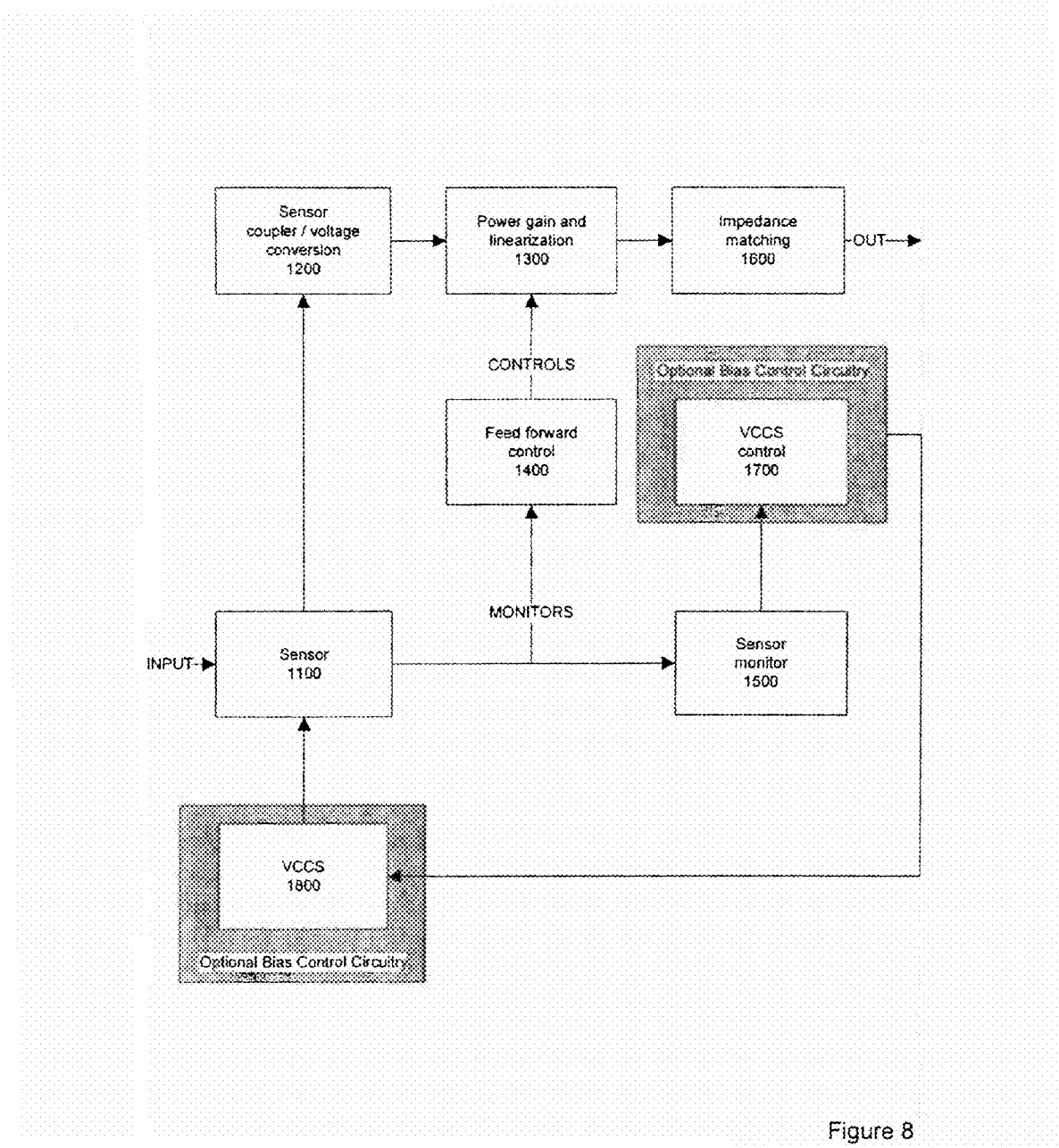
FIG. 8 shows a block diagram of an ATIA circuit designed in accordance with the present disclosure.

The sensor block 1100 shown in FIG. 8 provides a sensor and circuitry for converting sensor output into a current that varies linearly with the sensitivity of the sensor. In a preferred embodiment for use with optical networks, for example the PON networks described above, the sensor block 1100 comprises of a photo-diode D2, resistor R13, and inductance coil L2. The circuits for the preferred embodiments (without and with optional bias control) are shown in FIGS. 11 and 12. The sensor block 1100 in the preferred embodiment produces a current that is linearly proportional to the light received at the photo-diode. In an alternate embodiment, the sensor may be part of medical devices or other products that have sensors to measure aspects of the environment. In a second embodiment, the sensor is an electrochemical sensor that detects substances within a sample, such as blood chemical or environmental analysis sensor. In this embodiment, the sensor produces a current proportional to the trace elements detected in the sample under evaluation. It will be appreciated that sensors of this type produce very low current upon detection of trace elements, and that accuracy of analysis of the sample under evaluation is, at least in part, a function of the quality of the signal amplification provided by the present implementation.

Figure 13:
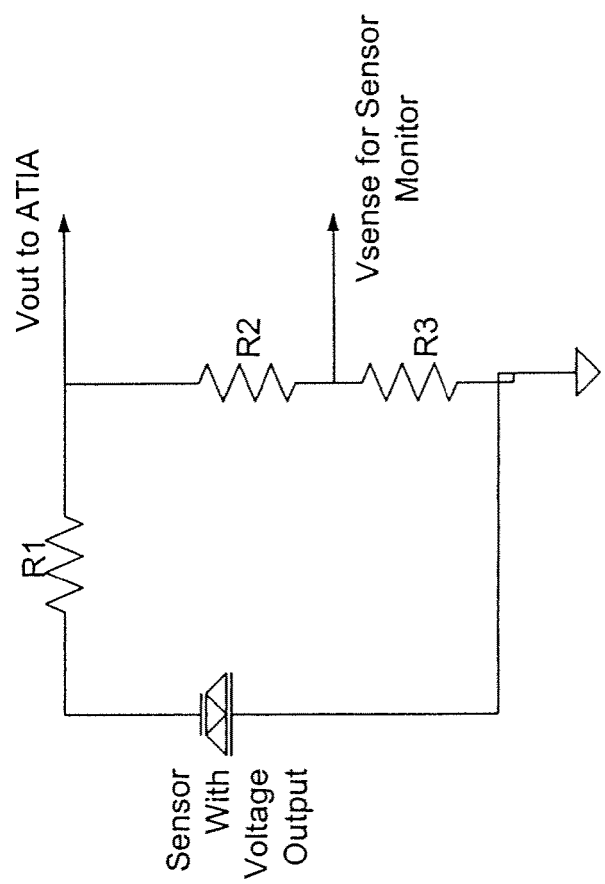
FIG. 13 is a schematic of an alternative embodiment of a sensor block for voltage producing sensors.

Alternate embodiments of sensor block 1100 support sensors that provide a varying voltage instead of a current, such as the circuit illustrated in FIG. 13. In this alternate embodiment, a voltage-producing sensor 1302, such as piezo-electric or capacitive transducer (e.g. radioactive, vacuum, and pressure sensors), the voltage producing sensor may be connected, in series with a resistor R1 or by capacitive coupling, to the emitter of the sensor, with the voltage output being provided to the ATIA (not shown in the Figure), and, with the use of a voltage divider R2 and R3 provides a sensing voltage to the sensor monitor (not shown in the Figure).

It will be appreciated that sensor block 1100 may be fabricated as part of a single die, which further reduces component count, production costs, unit size, and noise related to connections between components.

Again referring to FIG. 8, sensor block 1100 is operatively connected to sensor coupling and voltage conversion block 1200, is additionally operatively connected to the feed forward control block 1400, and is optionally operatively connected to sensor monitor block 1500. The sensor coupling and voltage recovery block 1200 is operatively connected to sensor block 1100 and power gain and linearization block 1300. Sensor coupling and voltage recovery block 1200 converts an input signal from the sensor block 1100 to a possibly different form of signal (e.g. current to voltage) compatible with the power gain and linearization block 1300.

A preferred embodiment of the sensor coupling and voltage recovery block 1200, is detailed in FIGS. 11 and 12. Block 1200 preferably comprises transistors X15 and X14, resistors R1-R4, R6, R7, R96, R65, R19, R23, capacitors C2, C3, C5, C13 and inductor L9. In the present apparatus, the input signal (from the sensor block 1100) is coupled into the emitter of transistor X15. Transistor X15 is biased in a common base configuration. This combined with the emitter coupling of the sensor provides a low impedance input with low noise and high bandwidth capabilities.

Voltage is generated across the series parallel combination of resistors R23, R2, R96, R4, and (Beta x R19), as shown in FIGS. 11 and 12. This voltage is then transferred to the emitter of X14 to the input of the power gain and linearization block 1300 referenced in FIG. 8.

The gain (Av1) in the sensor coupling and voltage recovery block 1200 is approximated by:

$$Av1 = (Ipd) \times (R2 + R96 \backslash\backslash R4)$$

Where Ipd=the AC current induced in the sensor.

In the preferred embodiment, this current is the current induced by the photo diode 1302 (best shown in FIG. 13) in the sensor block from the optical signal received at the photo diode.

It will be appreciated that the coupling circuit provides the ability to lower the equivalent input noise (EIN) of the TIA significantly because of the low load impedance for the recovered AC signal along with providing significant gain for the first stage.

Again, referring to FIG. 8, the power gain and linearization block 1300 is operatively connected to the sensor coupling and voltage recovery block 1200 and the feed forward control block 1400 for input, and produces an output that is operable coupled to the impedance matching block 1600.

The power gain and linearization block 1300 as shown in FIG. 8, and detailed in FIGS. 11 and 12, comprises transistors X13 and X12, resistors R49, R51, R52, R54, R56, R59, R64, capacitor C29 and inductor L10, as shown in both FIGS. 11 and 12. The feed forward control block 1400 in FIG. 8 operates with the power gain and linearization block 1300 to adjust its gain as a function of input sensor power to maintain the linearity of the amplifier.

It will be appreciated that the configuration of the amplifier, specifically, by connecting the common emitter transistor X13 to a common base transistor X12 directly from collector to emitter, provides advantages including linear power amplification, which in turn enables the circuit to have adjustable gain while maintaining linearity across a much broader operational range. It will be further appreciated that adjusting the gain by using a derivative of the DC sensor current in the emitter of X13 further enhances the low noise characteristics of the ATIA.

The gain (Av2) in power gain and linearization block 1300 is approximated by:

$$Av2 = (R54)/(R49 \backslash\backslash Rff)$$

Where Rff is the equivalent resistance of the feed forward control block 1400.

The feed forward control block 1400, as shown in FIG. 8, provides gain control to the power gain and linearization block 1300. The feed forward control block 1400 is operatively connected to the sensor block 1100 and the sensor monitor block 1500 for input, and is operatively connected to the power gain and linearization block 1300 to, in part, control the ATIA gain provided by that block.

The feed forward control block 1400 as shown in FIG. 8, and detailed in FIGS. 11 and 12, comprises transistors X7, X8, X9, three comparators (AMP2, AMP3, AMP4), voltage reference X16 and D1, resistor R80, current mirror C_M_1, capacitor C30, resistor ladder R81-84 and gain adjust resistors R74-76. Other components include resistors R77-R79, and R85-R91, and capacitors C31-C33. It will be appreciated that transistors X7-X9 are used in place of RF switches for gain adjustment to improve linearity and bandwidth performance to levels that could not be achieved using traditional RF switches or other current controlled resistive devices such as variable resistance RF diodes.

The comparators control the switching points of each transistor, switching the transistors between their on and off states. All transistors (X7-X9) that are in the on state provide maximum gain, and conversely all transistors in the off state provide minimum gain. The resistor ladder R81-84 of FIGS. 11 and 12 provides the switch point voltage for each comparator. Each switch point voltage represents a sensor input power value that the gain switch should occur. The values of resistors R81-R84 may be altered to further tune the present apparatus for specific applications, although it will be appreciated that no alteration or additional tuning is required for the present invention to perform within the broad frequency range of 10 Hz to 6 GHz.

In the disclosed apparatus, the current mirror C_M_1 in feed forward control block 1400, detects the current through sensor 1100. This current is directly proportional to the input power. In a preferred embodiment where the sensor is a photo diode, the current is proportional to the input optical power and is determined by the quantum efficiency of the photo diode.

So:

$$Icm = (\text{Quantum Efficiency} A/W)(\text{Input Optical Power } W)$$

Where Icm is the detected current mirror current;
A/W is the Quantum Efficiency;
A is the current through sensor 1100, in Amps; and
W is the Input Optical Power In the preferred embodiments, a current mirror circuit C_M_1, as detailed in the feed forward control block 1400 of FIGS. 11 and 12 is used to provide gain to the ATIA circuit. It will be understood by those skilled in the art that a current mirror circuit such as the one shown in the figures provides advantages over traditional methods such as a resistor of providing current gain, such as ease of manufacture in a variety of silicon technologies (e.g. FET, MOS). It will also be appreciated that a current mirror design such as the one described herein provides superior noise reduction using fewer components, further providing the advantages of lower cost to manufacturer, reduced power consumption, and a smaller silicon die footprint.

The sensor current mirror employed in the present apparatus is a modification of a Wilson Current Source/mirror. A resistor in the base of the transistor generating the reference current for the current mirror is used to generate a voltage that is directly proportional to the DC value of the sensor current produced by the sensor block 1100. This makes the current relationship slightly more linear than other traditional methods of attaining current gain.

In traditional prior art current mirror designs, the two transistors of the current mirror must be matched on a single die. In the preferred embodiment, the current mirror is used to provide current gain, so matching of the current mirror transistors on a single die is not required, but the same transistor type and model should be used for the current mirror. This reduces manufacturing complexity and part cost. It will be further appreciated that the current mirror configuration as used in the present apparatus is constructed using mismatched resistors within the current mirror, with the amount of current gain produced by the current mirror being adjustable by adjusting the relative values of these resistor.

This current mirror current is then converted to a voltage by pulling the current through resistor R80 shown within feed forward control block 1400 of FIGS. 11 and 12 and an internal small resistance. The voltage generated by R80 is used by the gain comparators and the voltage generated using the internal resistance is used by the sensor monitor block.

The following details the formula for the current gain Ai:

$$Ai = \frac{Is2[e^{\wedge}VBEX1(39.1)(1 + VCBX2/VAF)]}{ICM}$$

Where;
VEBX1=0.02558   ln((ICM/Is1)+1)+ICM(RE1)−IC2(RE2)
IC2=Is2[e^VBEX1(39.1)(1+VCBX2/VAF)]
Is=PN Saturation Current
VAF=Forward Bias Early Voltage The sensor monitor block 1500 provides a voltage output proportional to the average current level, which is operatively linked to the current monitor to, in part, adjust the input to the gain control circuitry. The sensor monitor block 1500 also provides a test point for external measure of power provided at the sensor. In a preferred embodiment, this test point provides an external measurement point of the optical power received at the photo-diode sensor.

The sensor monitor block 1500, as shown in FIG. 8 and detailed in FIGS. 11 and 12, comprises a non-inverting amplifier with a gain that is determined by resistance values R9 and RIO. This gain is equal to:

$$Apdm = (1 + R9/R10)$$

Where Apdm is gain of sensor monitor block 1500.

The impedance matching block 1600, shown generally in FIG. 8, and in more detail in FIGS. 11 and 12, matches the impedance of the external cable or trace to minimize reflections and other circuit-induced noise. The preferred impedance matching block 1600 comprises transistor X11, resistors R15, R17, R28, R29, R58, R66, capacitors C8, C37 and inductor L8. Transistor X11 provides a buffer from a high impedance collector to a low impedance high capacitance load such as 50 Ohm or 75 Ohm transmission line with the proper termination resistance. The passive components connected to the emitter of X11, along with the biasing for transistor X11, form a termination network for both forward path and transmit/return loss.

The optional bias control stabilization circuit is generally shown in FIG. 8 as an optional block which may be, but does not necessarily have to be used. The optional circuit comprises two additional functional blocks; a Voltage Controlled Current Source (VCCS) Control block 1700 and the VCCS block 1800.

The VCCS control block 1700 is an optional block that controls the VCCS circuit using the output of the sensor monitor block 1500 as its input. It consists of an amplifier AMP6, resistors R98-100, R16, and R14, and capacitors C9 and C47.

The VCCS block 1800 is a well known, widely used circuit block therefore; it will not be explained in detail here. The VCCS block 1800 is operatively coupled to the VCCS control and the sensor block 1100. In some physical implementations, the VCCS block may be combined with its control block and the sensor block. The basic function of the VCCS block 1800 is to vary the sourced current with a particular voltage to current ratio when a control voltage is applied. In one embodiment this block is designed to have a voltage to current gain ratio of about 0.001. Details of the preferred embodiment of the block 1700 and 1800 are shown in FIG. 12.

An alternate embodiment includes constructing the disclosed system using FET technology, the latter including but is not limited to: GaAs, CMOS, InGaAsPh, and InPh technologies. Implementation of the described technology requires extra care to keep the bias current stable or the transconductance (gm) because changes in the bias current dramatically causes changes in the gate-to-source voltage (Vgs) with drain-to-source current (Ids). The bias point also effects the values of gain-to-source resistance (Rgs) and drain-to-source resistance (Rds), which change both the gain and the frequency response of the circuit.

Figure 14:
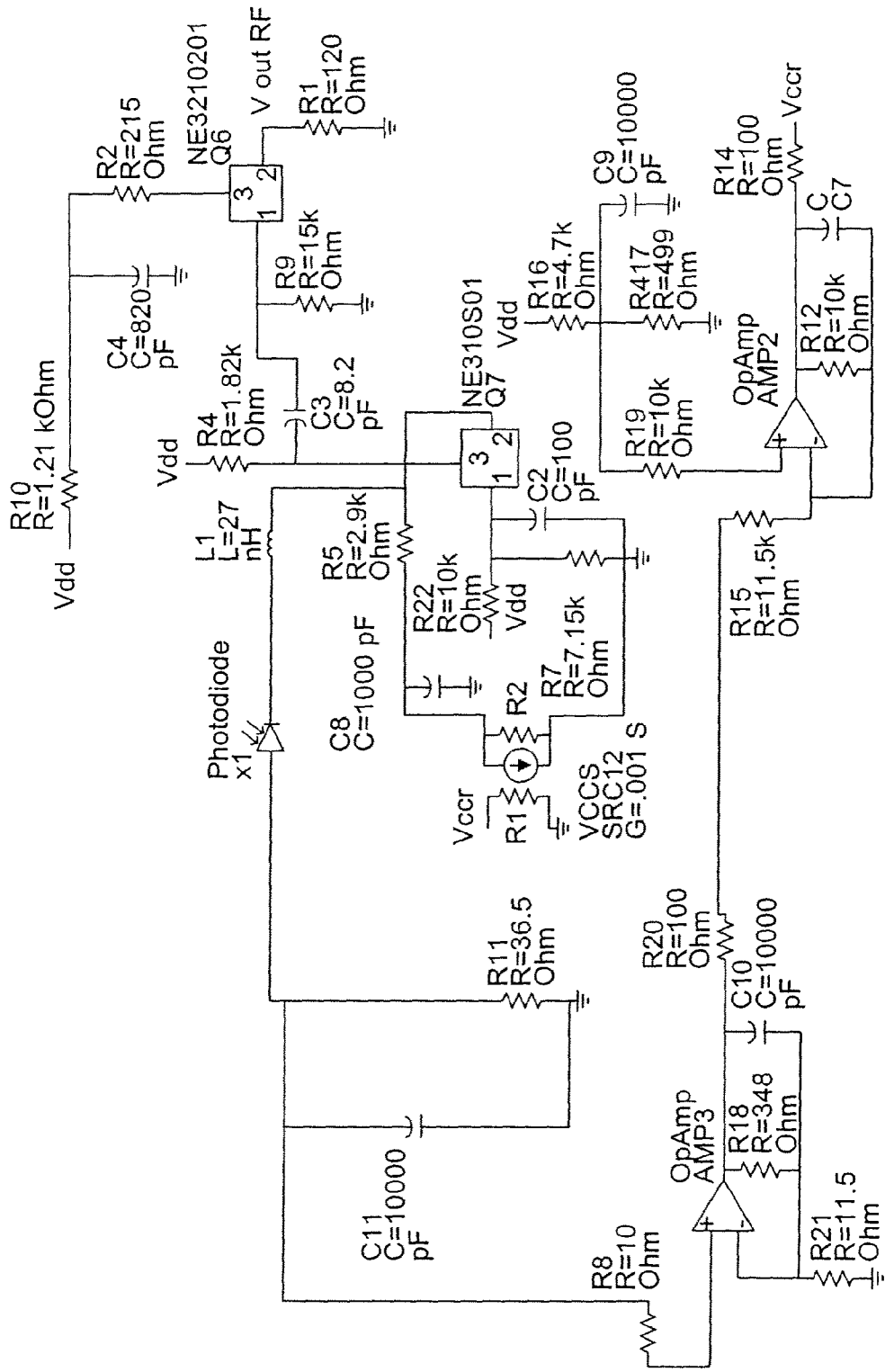
FIG. 14 is a schematic of an alternative embodiment of a FET-based implementation of a system comprising a sensor block, sensor coupler/voltage conversion block, VCCS control block and VCCS block.

The circuit in FIG. 14 shows one preferred embodiment of the coupling stage using FET technology. In the FET version of the described ATIA, consisting of Resistors R1, R2, R4, R5, R7, R8, R10, R11, R12, R14, R16, R17, R18, R19, R20, R21, R22, OpAmps AMP2 and AMP3, photo-diode X1, capacitors C3, C4, C7, C8, C9, C10, C11, inductor L1, and transistors Q6 and Q7, the first transistor (coupling transistor) is biased at a specific Vgs which is dependent on the transistor type (enhancement or depletion mode). This produces the specific Rgs needed to limit both the EIN and maximize the frequency response of the ATIA. The operation of the bias control circuit is the same as what is used for the bipolar junction version of the described ATIA.

The VCCS Control block 1700 preferably contains a voltage reference and a difference amplifier as shown in FIG. 12. The difference amplifier is configured to have a gain of one and a frequency bandwidth of 16 KHz. The bandwidth is limited to avoid any gain oscillation in the operating frequency band. The reference voltage is set to the optimum value for the collector current of the VCCS which provides the best EIN and linearity for the sensor coupling and voltage recovery block 1200's dynamic range. In the alternative preferred embodiment shown in FIG. 12, this reference voltage is determined by a resistor divider, but the reference voltage may be supplied by any number of different methods of providing a voltage reference. A reference voltage, for example, can be provided to input one of the difference amplifier, while the output of the sensor monitor block 1500 can be connected to input two of the difference amplifier (AMP6). With this arrangement the output voltage of the VCCS control block 1700 decreases as the sensor monitor 1500 output voltage increases. This then generates a voltage that makes the VCCS current inversely proportional to the sensor current which enables stabilization of the bias current in the coupling stage. It will be appreciated that this substantially improves the performance of photo-diode sensors as shown in the preferred embodiments of the present disclosure.

These advancements to the state of the art are a non-trivial exercise, and require exemplary knowledge of: a) optical transmission component design and properties, b) high level RF design techniques, and c) how both sensor and amplifier non-linearity's effects signals using both vestigial sideband and QAM/QPSK modulation are necessary to create the linearization circuits necessary for this invention.

While this invention has been particularly shown and described with references to preferred embodiments thereof, it will be understood by those skilled in the art that various changes in form and details may be made therein without departing from the spirit and scope of the invention as defined by the appended claims.

DEFINITION LIST

| Term | Definition |
| --- | --- |
| ATIA | Analog Trans-Impedance Amplifier(TIA), Linearized TIA |
| CATV | Cable Television |
| CNR | Carrier to Noise Ratio |
| CO | Central Office(Building used to House Switching and Transmission equipment for a Telephone Company) |
| EDFA | Erbium Doped Fiber Amplifier |
| EIN | Input-referred noise or EIN (Equivalent Input Noise) is the noise voltage or current that, when applied to the input of the noiseless circuit, generates the same output noise as the actual circuit does: This value is very important parameter when determining the signal to noise ratio of detected low level analog or digital signals. |
| FTTH | Fiber To The Home |
| Forward Bias Early Voltage | The Early voltage of the forward bias current |
| Head-end | Building used in CATV distribution that houses the Satellite Receivers and Optical transmitters for Transmission of the TV Video Signals. It also has the Voice and Data switching EQ. |

-continued

| Term | Definition |
|---|---|
| Hub | Building used in CATV distribution that houses the Optical transmitters for Transmission of the TV Video Signals. It also has the Voice and Data switching EQ. |
| NTSC | National Television Standards Committee |
| ONT | Optical Network Termination, Box used in the FTTH system that attaches to Office building or home. This Box converts the Optical signals to the Voice, Data and Video signal used in the home or office. |
| PON | Passive Optical Network |
| SiGe | Silicon Germanium- High frequency low noise semiconductor process used heavily in Wireless Systems. |
| Triceiver | Optical device which includes three functions and transmits and receives using two or three wavelengths. It is used for Bidirectional data transmission with single or dual wavelengths and reception of a third wavelength for broadcast of wideband analog or digital information. |

What is claimed is:

1. A circuit for use in an optical network, the circuit comprising:
   a photodiode for sensing an input optical signal, and providing an output current signal as a function of the input signal; and
   a trans-impedance amplifier connected to the photodiode for amplifying the output of the photodiode, wherein the trans-impedance amplifier comprises a current mirror, wherein the trans-impedance amplifier has a gain as a function of resistor values used in the current mirror.

2. A circuit according to claim 1, wherein the circuit is incorporated into a single die.

3. A circuit according to claim 1, wherein the circuit is configured and arranged as an upstream component.

4. A circuit according to claim 1, wherein the circuit is configured and arranged as a head end.

5. A circuit according to claim 1, where the circuit is configured and arranged as a module in a passive optical network.

6. A circuit according to claim 1, wherein the trans-impedance amplifier further comprises a feed forward gain control.

7. The circuit of claim 1, wherein the trans-impedance amplifier includes a Field Effect Transistor (FET).

8. The circuit of claim 1, wherein the photodiode comprises gallium-arsenide (GaAS).

9. The circuit of claim 1, wherein the photodiode comprises indium-gallium-arsenide-phosphide (InGaAsPh).

10. The circuit of claim 1, wherein the photodiode comprises indium-phosphide (InPh).

11. The circuit of claim 7, wherein the FET comprises silicon-germanium (SiGe).

12. The circuit of claim 7, wherein the FET is a CMOS transistor.

13. The circuit of claim 7, wherein the FET is a BiCMOS transistor.

14. The circuit of claim 1, wherein the trans-impedance amplifier comprises a Bipolar Junction Transistor (BJT).

15. The circuit of claim 1, wherein the trans-impedance amplifier further comprises a linearization stage.

16. The circuit of claim 15, wherein the linearization stage comprises a pre-amplifier stage and a post-amplifier stage with complimentary distortion characteristics.

17. A circuit for use in an optical network, the circuit comprising:
   a coupling stage configured to receive an input signal from a photodiode; and
   a trans-impedance amplifier connected to the coupling stage for amplifying the input signal, wherein the trans-impedance amplifier comprises a current mirror, wherein the trans-impedance amplifier has a gain as a function of resistor values used in the current mirror.

* * * * *